(12) United States Patent
Jang et al.

(10) Patent No.: US 11,903,249 B2
(45) Date of Patent: Feb. 13, 2024

(54) DISPLAY DEVICE AND METHOD OF FABRICATING THE SAME

(71) Applicant: Samsung Display Co., LTD., Yongin-si (KR)

(72) Inventors: Dae Hwan Jang, Yongin-si (KR); Jae Been Lee, Yongin-si (KR); Jin Ho Cho, Yongin-si (KR)

(73) Assignee: SAMSUNG DISPLAY CO., LTD, Yongin-si (KR)

( * ) Notice: Subject to any disclaimer, the term of this patent is extended or adjusted under 35 U.S.C. 154(b) by 96 days.

(21) Appl. No.: 17/315,897

(22) Filed: May 10, 2021

(65) Prior Publication Data

US 2022/0037420 A1 Feb. 3, 2022

(30) Foreign Application Priority Data

Jul. 30, 2020 (KR) ........................ 10-2020-0095357

(51) Int. Cl.
*H10K 59/121* (2023.01)
*H10K 50/844* (2023.01)
(Continued)

(52) U.S. Cl.
CPC ......... *H10K 59/121* (2023.02); *H10K 50/844* (2023.02); *H10K 59/131* (2023.02);
(Continued)

(58) Field of Classification Search
CPC .. H10K 59/1201; H10K 59/18; H10K 59/121; H10K 59/131; H10K 59/38;
(Continued)

(56) References Cited

U.S. PATENT DOCUMENTS 7,239,367 B2 7/2007 Jin et al.
9,367,094 B2 6/2016 Bibl et al.
(Continued)

FOREIGN PATENT DOCUMENTS

CN 110910774 3/2020
KR 10-1148791 5/2012
(Continued)

*Primary Examiner* — Vongsavanh Sengdara
(74) *Attorney, Agent, or Firm* — KILE PARK REED & HOUTTEMAN PLLC

(57) ABSTRACT

A display device includes a base layer including a first surface and a second surface, pixels and first lines that are disposed on the first surface, second lines disposed on the second surface and corresponding to the first lines, a multi-layered etch stopper layer disposed on the first surface and disposed between the base layer and the first lines, and via holes penetrating the base layer and the multi-layered etch stopper layer, the via holes connecting the first lines to the second lines. The multi-layered etch stopper layer includes a first etch stopper layer disposed on the first surface and surrounding each of the via holes, the first etch stopper layer including an inorganic layer, and a second etch stopper layer entirely disposed on the first surface including the first etch stopper layer, the second etch stopper layer being open in a region corresponding to the via holes.

20 Claims, 25 Drawing Sheets

(51) Int. Cl.
  *H10K 59/38*    (2023.01)
  *H10K 59/131*   (2023.01)
  *H10K 71/00*    (2023.01)
  *H10K 59/12*    (2023.01)

(52) U.S. Cl.
  CPC ............ *H10K 59/38* (2023.02); *H10K 71/00* (2023.02); *H10K 59/1201* (2023.02)

(58) Field of Classification Search
  CPC ............ H10K 59/124; H10K 25/0753; H10K 50/844; H10K 71/00; H01L 25/167
  See application file for complete search history.

(56) References Cited

U.S. PATENT DOCUMENTS

| | | | |
|---|---|---|---|
| 10,566,318 B2 | 2/2020 | Lee et al. | |
| 2016/0293888 A1* | 10/2016 | Shim | H10K 59/124 |
| 2018/0053905 A1* | 2/2018 | Lee | H10K 59/126 |
| 2019/0319080 A1* | 10/2019 | Ke | H10K 59/1275 |
| 2020/0312829 A1* | 10/2020 | Ke | G06F 3/0445 |
| 2021/0375702 A1* | 12/2021 | Xiao | H01L 22/32 |
| 2022/0383811 A1* | 12/2022 | Liu | H10K 59/123 |

FOREIGN PATENT DOCUMENTS

| | | |
|---|---|---|
| KR | 10-1820258 | 1/2018 |
| KR | 10-2019-0071274 | 6/2019 |

\* cited by examiner

DISPLAY DEVICE AND METHOD OF FABRICATING THE SAME

CROSS-REFERENCE TO RELATED APPLICATION(S)

This application claims priority to and benefits of Korean Patent Application 10-2020-0095357 under 35 U.S.C. § 119(a), filed on Jul. 30, 2020 in the Korean Intellectual Property Office, the entire contents of which are incorporated herein by reference.

BACKGROUND

1. Technical Field

The disclosure generally relates to a display device and a method of fabricating the same.

2. Discussion of the Related Art

Recently, interest in information displays has increased. Accordingly, research and development of display devices has been continuously conducted.

SUMMARY

Embodiments may provide a display device capable of reducing a non-display region and a method of fabricating the display device.

In accordance with an aspect of the disclosure, a display device may include a base layer including a first surface and a second surface, pixels and first lines that are disposed on the first surface, second lines disposed on the second surface and corresponding to the first lines, a multi-layered etch stopper layer disposed on the first surface and disposed between the base layer and the first lines, and via holes penetrating the base layer and the multi-layered etch stopper layer, the via holes connecting the first lines to the second lines. The multi-layered etch stopper layer may include a first etch stopper layer disposed on the first surface and surrounding each of the via holes, the first etch stopper layer including an inorganic layer, and a second etch stopper layer entirely disposed on the first surface including the first etch stopper layer, the second etch stopper layer being open in a region corresponding to the via holes.

The second etch stopper layer may include an organic layer.

The multi-layered etch stopper layer may further include a third etch stopper layer entirely disposed on the second etch stopper layer, the third etch stopper layer being open in the region corresponding to the via holes.

The third etch stopper layer may include an inorganic layer.

At least one of the first etch stopper layer, the second etch stopper layer, and the third etch stopper layer may include a multi-layered inorganic insulating layer or a multi-layered organic insulating layer.

The multi-layered etch stopper layer may further include at least one of a fourth etch stopper layer disposed on the third etch stopper layer and surrounding each of the via holes, the fourth etch stopper layer including an inorganic layer, a fifth etch stopper layer entirely disposed on the first surface including the fourth etch stopper layer, the fifth etch stopper layer being open in the region corresponding to the via holes, the fifth etch stopper layer including an organic layer, and a sixth etch stopper layer entirely disposed on the fifth etch stopper layer, the sixth etch stopper layer being open in the region corresponding to the via holes, the sixth etch stopper layer including an inorganic layer.

The fourth etch stopper layer may include a plurality of inorganic layer patterns surrounding each of the via holes, the plurality of inorganic layer patterns being separated from each other.

The first etch stopper layer may include a plurality of inorganic layer patterns surrounding each of the via holes, the plurality of inorganic layer patterns being separated from each other.

The first lines may include first gate lines and first data lines, the first gate lines and the first data lines being connected to the pixels. The via holes may include first via holes overlapping respective first gate lines, and second via holes overlapping respective first data lines.

The second lines may include second gate lines each connected to each of the first gate lines through at least one of the first via holes, and second data lines each connected to each of the first data lines through at least one of the second via holes.

The pixels may include circuit elements connected to the first gate lines and the first data lines, and light emitting elements connected to the circuit elements.

The display device may include a pixel circuit layer disposed on the multi-layered etch stopper layer, the pixel circuit layer including the circuit elements and the first lines, and a display element layer disposed on the pixel circuit layer, the display element layer including the light emitting elements.

The display device may further include at least one of a light conversion layer disposed on the display element layer, and a thin film encapsulation layer disposed on the display element layer or the light conversion layer.

The light conversion layer may include at least one of a color conversion layer disposed over a light emitting element included in at least one pixel among the pixels, the color conversion layer including color conversion particles that convert light of a first color, which may be emitted from the light emitting element, into light of a second color, and a color filter disposed on the display element layer or the color conversion layer.

The via holes may be disposed in a display region in which the pixels may be disposed.

The display device may further include a protective layer entirely disposed on the second surface including the second lines, the protective layer exposing a region of the second lines in a pad region.

The pad region may be disposed on the second surface and overlap a display region. The display region may include the pixels and display an image through the first surface.

In accordance with another aspect of the disclosure, a method of fabricating a display device may include preparing a base layer in which via hole regions may be defined, irradiating laser onto the via hole regions, forming, on a first surface of the base layer, a first etch stopper layer including inorganic layer patterns covering the via hole regions, forming a second etch stopper layer on the first surface of the base layer including the first etch stopper layer, the second etch stopper layer including an organic layer, forming a third etch stopper layer on the second etch stopper layer, the third etch stopper layer including an inorganic layer, forming pixels and first lines on the third etch stopper layer, forming via holes exposing a region of each of the first lines by etching the base layer, the first etch stopper layer, the second etch stopper layer, and the third etch stopper layer in the via hole regions, and forming second lines on a second surface of the base layer to be each connected to each of the first lines through at least one via hole.

The method may further include forming a protective layer covering the second lines, and etching the protective layer to expose a region of the second lines in a pad region.

The method may further comprise at least one of forming the via holes in a display region in which the pixels may be disposed, and forming the pad region in the display region.

BRIEF DESCRIPTION OF THE DRAWINGS

Example embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION OF THE EMBODIMENTS

Figure 1:
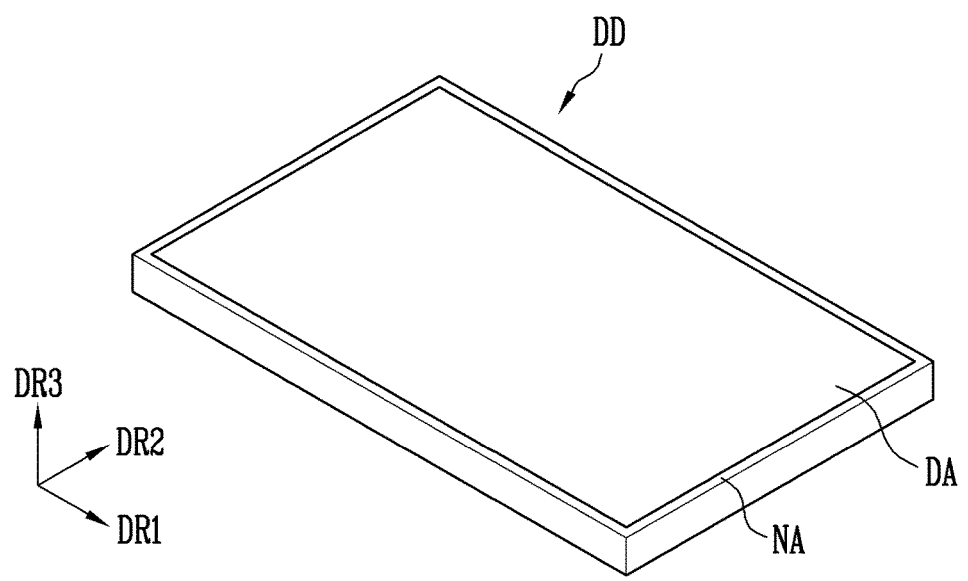
FIG. 1 is a schematic perspective view illustrating a display device in accordance with an embodiment of the disclosure.

The disclosure merely illustrates details with respect to particular examples. Various changes are possible and should also be considered to be within the scope of the disclosure.

Stated differently, the disclosure is not limited to embodiments disclosed below, and may be implemented in various forms. For example, each embodiment disclosed below may be independently embodied or be combined with at least another embodiment prior to being embodied.

In the following embodiments and the attached drawings, elements not directly related to the disclosure may be omitted from depiction, and dimensional relationships among individual elements in the attached drawings are illustrated only for ease of understanding but not to limit the actual scale. It should note that in giving reference numerals to elements of each drawing, like reference numerals refer to like elements even though like elements are shown in different drawings.

As used herein, the singular forms are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

"About" or "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2A:
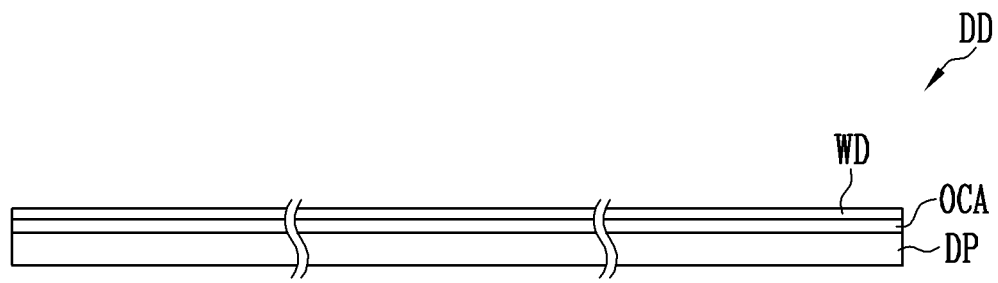
FIGS. 2A and 2B are schematic sectional views each illustrating a display device in accordance with an embodiment of the disclosure.
Figure 2A:
Figure 2B:
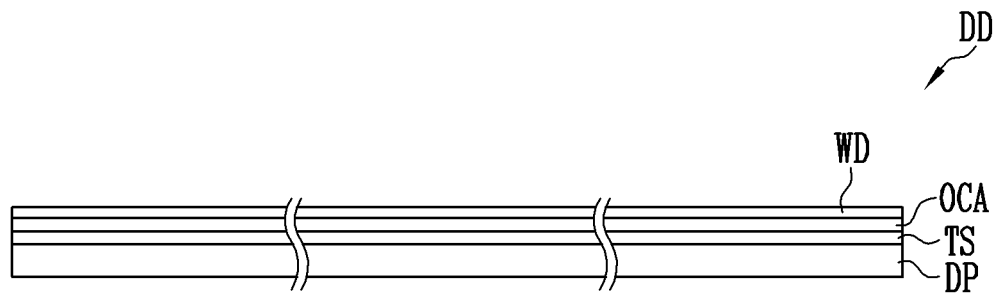
Figure 2B:
Figure 3A:
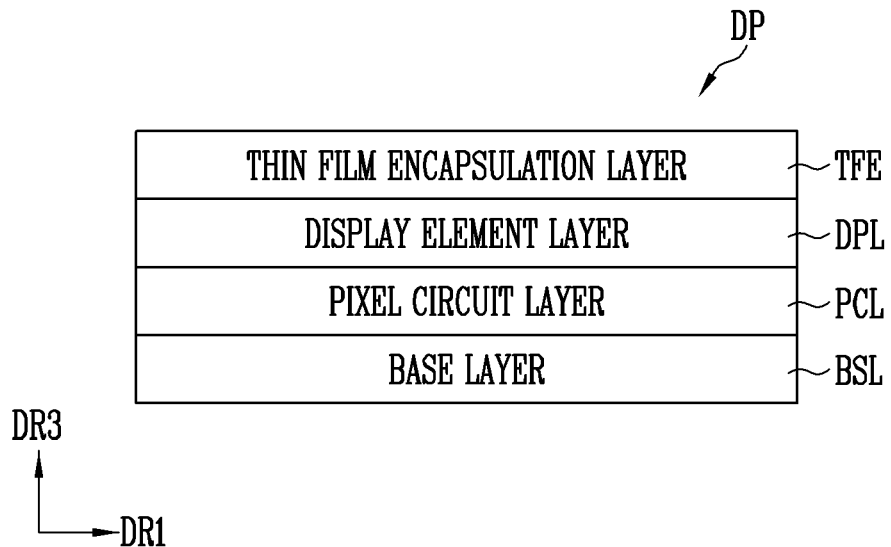
FIGS. 3A and 3B are schematic sectional views each schematically illustrating a configuration of a display panel in accordance with an embodiment of the disclosure.
Figure 3B:
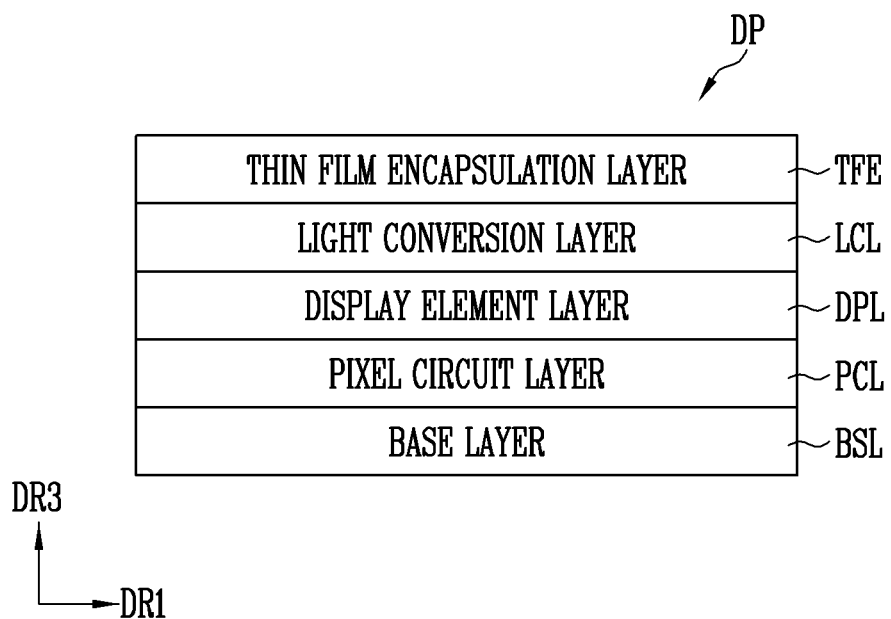

FIG. 1 is a schematic perspective view illustrating a display device DD in accordance with an embodiment of the disclosure. FIGS. 2A and 2B are schematic sectional views each illustrating a display device DD in accordance with an embodiment of the disclosure. FIGS. 3A and 3B are schematic sectional views each schematically illustrating a configuration of a display panel DP in accordance with an embodiment of the disclosure.

Referring to FIG. 1, the display device DD may include a display region DA and a non-display region NA (also, referred to as a "bezel region"). The display region DA may be a region which includes pixels, thereby displaying an image. The non-display region NA may be a region other than the display region DA, and the image may not be displayed in the non-display region NA.

The display region DA may have various shapes, and include pixels arranged according a rule. In an example, the display region DA may have various shapes including a rectangular shape, a circular shape, an elliptical shape, and the like. Also, the display region DA may include pixels arranged according to various arrangement structures including a stripe arrangement, a pentile arrangement, and the like.

The display region DA may be formed on at least one surface of the display device DD. In an example, the display region DA may be formed on a front surface of the display device DD. In addition, the display region DA may be additionally formed on a side surface and/or a rear surface of the display device DD.

The non-display region NA may be located at a periphery of the display region DA, and may selectively include lines, pads, and/or a driving circuit, which may be connected to the pixels of the display region DA. In case that the area of the non-display region NA is reduced, the size of the display region DA may be expanded without increasing the size (e.g., the area) of the display device DD. Accordingly, a larger screen can be provided. In addition, in case that the non-display region NA may be reduced, viewing of a boundary between a plurality of display devices DD can be minimized, and a more natural screen can be provided in case that a multi-screen display device is implemented by using multiple display devices DD.

The display device DD may be provided in various shapes. In an example, the display device DD may be provided in a rectangular plate shape, but the disclosure is not limited thereto. For example, the display device DD may have a shape such as a circular shape or an elliptical shape. Although a case where the display device DD has faceted corners is illustrated in FIG. 1, the disclosure is not limited thereto. For example, the display device DD may include curved corners.

For convenience, a case where the display device DD has a rectangular plate shape including a pair of long sides and a pair of short sides will be illustrated in FIG. 1. An extending direction of the long sides will be referred to as a first direction DR1, an extending direction of the short sides will be referred to as a second direction DR2, and a direction (e.g., a thickness or height direction of the display device DD) perpendicular to the extending directions of the long sides and the short sides will be referred to as a third direction DR3. However, aspects may be changed according to the shape of the display device DD.

The display device DD may have flexibility to be deformable in at least one region, or may have no flexibility such that any substantial deformation may not occur in the entire region. For example, the display device DD may be a flexible display device or a rigid display device. In case that the display device DD has flexibility in at least one region, the display device DD may be deformed in a form in which the display device DD may be folded, curved or rolled at a portion having the flexibility.

Referring to FIG. 2A, the display device DD may include a display panel DP and a window WD disposed on the top of the display panel DP. In an embodiment, the window WD may be integrally fabricated with the display panel DP. For example, the window WD may be directly formed on a surface of the display panel DR In another embodiment, after the window WD is fabricated separately from the display panel DP, the window WD may be coupled to the display panel DP through an optically clear adhesive (or gluing) member OCA.

The display panel DP may include pixels for displaying an image, and be a display panel of various kinds and/or various structures. In an example, the display panel DP may be a self-luminescent display panel such as an Organic Light Emitting Display panel (OLED panel) using an organic light emitting diode as a light emitting element, a Nano-scale LED Display panel (Nano LED panel) using a nano-scale light emitting diode as a light emitting element, a Quantum Dot Organic Light Emitting Display panel (QD OLED panel) using an organic light emitting diode and a quantum dot, or a Quantum Dot Nano-scale LED Display panel (QD Nano LED panel) using a nano-scale light emitting diode and a quantum dot. In other embodiments, the display panel DP may be a non-self-luminescent display panel such as a Liquid Crystal Display panel (LCD panel), an Electro-Phoretic Display panel (EPD panel), or an Electro-Wetting Display panel (EWD panel). In case that the non-self-luminescent display panel is used as the display panel DP, the display device DD may further include a light source device (e.g., a backlight unit) for supplying light to the display panel DP.

The window WD for protecting an exposed surface of the display panel DP may be provided on the display panel DP. The window WD may protect the display panel DP from an external impact, and may provide an input surface and/or a display surface to a user.

The window WD may be formed of various materials including glass, plastic, or a combination thereof, and be configured as a single layer or a multi-layer. Also, the window WD may have flexibility in at least one region, or have no flexibility.

Referring to FIG. 2B, the display device DD may further include a touch sensor TS. In addition, the display device DD may include other sensors (e.g., a fingerprint sensor, a pressure sensor, and a temperature sensor) of various kinds and/or various types, and/or an input sensing device.

The touch sensor TS may be disposed on at least one surface of the display panel DP to detect a touch input of a user. In an example, the touch sensor TS may be provided on a front surface (i.e., an upper surface on which an image may be displayed) of the display panel DP to be disposed between the display panel DP and the window WD, but the disclosure is not limited thereto.

In an embodiment, the touch sensor TS may be integrally fabricated with the display panel DR For example, sensor electrodes and/or a sensor element, used to constitute the touch sensor TS may be directly formed on at least one surface of the display panel DP.

In another embodiment, after the touch sensor TS is fabricated separately from the display panel DP, the touch sensor TS may be provided at the periphery of the display panel DP. In an example, the touch sensor TS may be disposed and/or attached on at least one surface of the display panel DP.

The touch sensor TS may be a touch sensor of various kinds and/or various structures. For example, the touch sensor TS may be a self or mutual capacitive touch sensor, a resistive touch sensor, a piezoelectric touch sensor, an ultrasonic touch sensor, and/or a hybrid touch sensor having a combination of different kinds of sensors.

When the display device DD includes at least one kind of sensor including the touch sensor TS, the display device DD may include a sensing region in which the sensor may be provided. In an embodiment, the sensing region may be disposed in the display region DA, but the disclosure is not limited thereto.

Referring to FIG. 3A, the display panel DP may include a base layer BSL, and a pixel circuit layer PCL, a display element layer DPL, and a thin film encapsulation layer TFE, which may be sequentially disposed on a surface of the base layer BSL. However, the structure of the display panel DP is not limited thereto. For example, in another embodiment, the display element layer DPL may be first disposed on the surface of the base layer BSL, and the pixel circuit layer PCL may be disposed on the display element layer DPL.

Additionally, some components of the display panel DP may be omitted or be replaced with other components. For example, in case that the display panel DP is a display panel of a passive display device, the pixel circuit layer PCL may be omitted. Lines for driving pixels may be directly connected to and/or formed on the display element layer DPL. In some embodiments, the thin film encapsulation layer TFE may not be formed, but an upper substrate may be disposed on the surface of the base layer BSL. The upper substrate may be coupled to the base layer BSL by a sealant.

The base layer BSL may be a rigid or flexible substrate (or film). In an embodiment, in case that the base layer BSL is the rigid substrate, the base layer BSL may be one of a glass substrate, a quartz substrate, a glass ceramic substrate, a crystalline glass substrate, or a combination thereof. In another embodiment, in case that the base layer BSL is the flexible substrate, the base layer BSL may be one of a film substrate, a plastic substrate, or a combination thereof, which may include a polymer organic material. Also, the base layer BSL may include a fiber glass reinforced plastic (FRP).

The pixel circuit layer PCL may be provided on the surface of the base layer BSL. The pixel circuit layer PCL may include circuit elements for constituting a pixel circuit of each pixel and various lines connected to the pixel circuit elements. In an example, the pixel circuit layer PCL may include transistors and a storage capacitor, which constitute a pixel circuit of each pixel, and gate lines, data lines, and power lines, which may be connected to the pixel(s). In some embodiments, the gate lines may include at least scan lines, and selectively further include other kinds of control lines in addition to the scan lines.

The display element layer DPL may be disposed on the pixel circuit layer PCL. The display element layer DPL may include a light emitting element constituting a light source of each pixel. In an embodiment, the light emitting element may be an organic light emitting diode. In another embodiment, the light emitting element may be an inorganic light emitting diode (e.g., a nano-scale inorganic light emitting diode having a nano-scale or micro-scale size). However, in the disclosure, the kind, structure, shape, and/or size of the light emitting element provided in each pixel is not particularly limited.

The thin film encapsulation layer TFE may be disposed on the display element layer DPL. The thin film encapsulation layer TFE may be an encapsulation substrate or a multi-layered encapsulation layer. In case that the thin film encapsulation layer TFE may have a form of the encapsulation layer, the thin film encapsulation layer TFE may include an inorganic layer and/or an organic layer. For example, the thin film encapsulation layer TFE may have a multi-layered structure in which an inorganic layer, an organic layer, and an inorganic layer may be sequentially stacked. The thin film encapsulation layer TFE may prevent external air or moisture from penetrating into the display element layer DPL and the pixel circuit layer PCL, to protect the pixels.

Referring to FIG. 3B, the display panel DP may further include a light conversion layer LCL for converting light emitted from the display element layer DPL. For example, in case that the display panel DP displays an image on a front surface of the display panel DP by emitting light in an upper direction of the display element layer DPL (e.g., the third direction DR3), the light conversion layer LCL may be disposed on the top of the display element layer DPL. In an example, the light conversion layer LCL may be provided between the display element layer DPL and the thin film encapsulation layer TFE.

The light conversion layer LCL may include a color filter including a color filter material of a color and/or a color conversion particle (e.g., a quantum dot) corresponding to the color, to convert light generated in the display element layer DPL. For example, the light conversion layer LCL may allow light having a specific wavelength band in the light generated in the display element layer DPL to be selectively transmitted therethrough, and/or convert a wavelength band of the light generated in the display element layer DPL.

In FIGS. 3A and 3B, an exemplary configuration of the display panel DP has been schematically described by assuming that the display panel DP is a light emitting display panel. However, the disclosure is not limited thereto. For example, the configuration of the display panel DP may be variously modified according to the kind of the display device.

Figure 4:
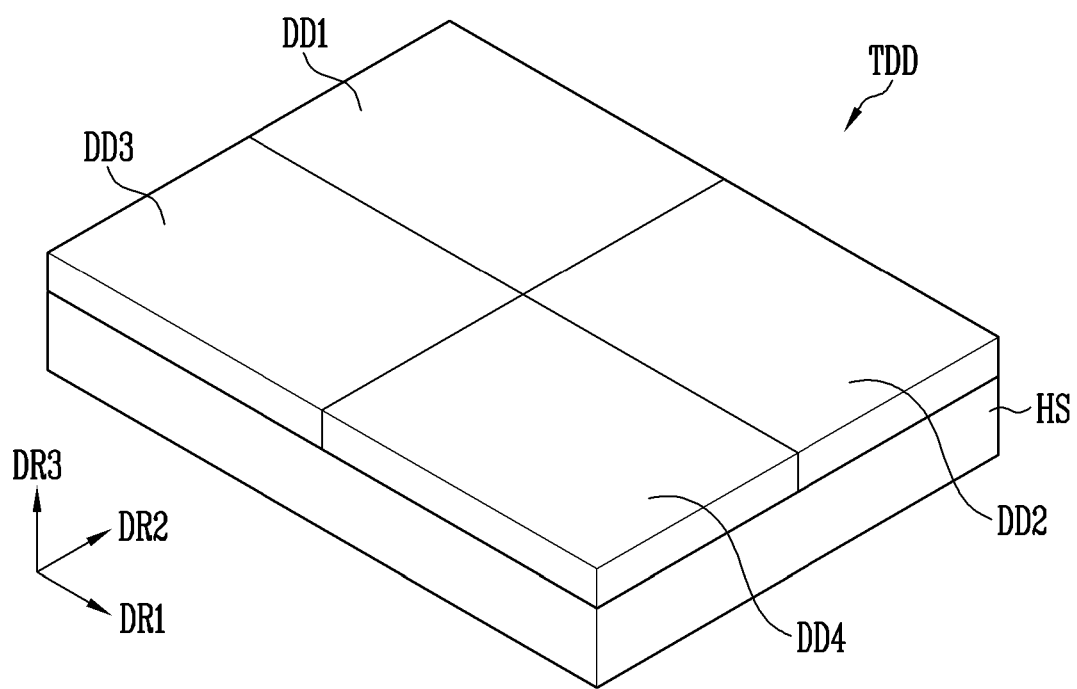
FIG. 4 is a schematic perspective view illustrating a multi-screen display device in accordance with an embodiment of the disclosure.
Figure 5A:
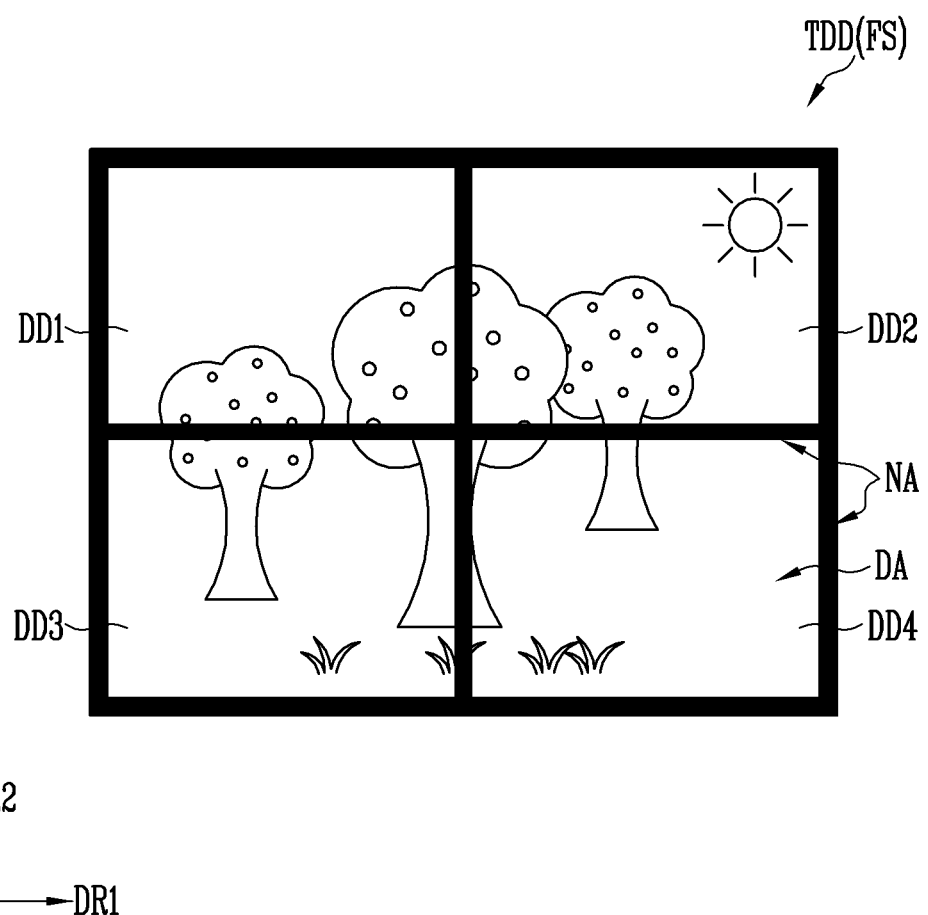
FIGS. 5A and 5B are schematic plan views each illustrating a multi-screen display device in accordance with an embodiment of the disclosure.
Figure 5B:
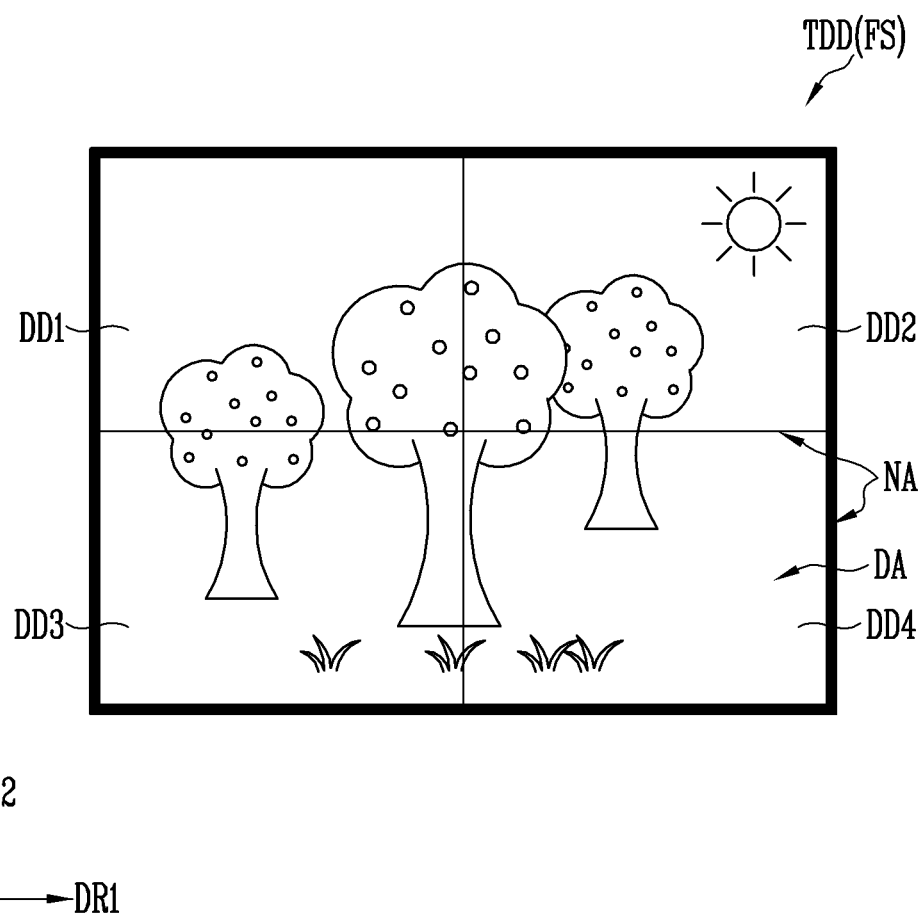

FIG. 4 is a schematic perspective view illustrating a multi-screen display device TDD in accordance with an embodiment of the disclosure. FIGS. 5A and 5B are schematic plan views each illustrating a multi-screen display device TDD in accordance with an embodiment of the disclosure. In an example, each of FIGS. 5A and 5B illustrates a front surface FS (e.g., a display surface) of the multi-screen display device TDD shown in FIG. 4.

Referring to FIG. 4, the multi-screen display device TDD (also, referred to as a "tiled display") may include a plurality of display devices DD1 to DD4 and a housing HS. In an example, the multi-screen display device TDD may include the plurality of display devices DD1 to DD4 arranged in a matrix form along a first direction DR1 and/or a second direction DR2.

The display devices DD1 to DD4 may display individual images or display one image divided into pieces. In an embodiment, the display devices DD1 to DD4 may include display panels having the same kind, the same structure, the same size, and/or the same type, but the disclosure is not limited thereto.

The housing HS allows the display devices DD1 to DD4 to be physically coupled to each other such that the display devices DD1 to DD4 can constitute one multi-screen display device TDD. The housing HS may support the display devices DD1 to DD4 on the bottom of the display device DD1 to DD4, and have a fastening member and/or a groove structure, used to stably fix the display devices DD1 to DD4.

Referring to FIGS. 5A and 5B, each of the display devices DD1 to DD4 displays an image in only a display region DA thereof. Therefore, an image (e.g., part of an image) displayed on a screen of the multi-screen display device TDD may be cut off due to a non-display region NA (e.g., a seam region) located in a boundary region between the display devices DD1 to DD4.

In particular, in case that the width and/or an area of a non-display region NA of each of the display devices DD1 to DD4 may be relatively large as shown in FIG. 5A, the cutoff of the image in the boundary region between the display devices DD1 to DD4 may be more pronounced.

On the other hand, in case that the width and/or an area of a non-display region NA of each of the display devices DD1 to DD4 may be reduced as shown in FIG. 5B or in case that the non-display region NA is substantially removed, viewing of the boundary region between the display devices DD1 to DD4 can be prevented or reduced, and an image more naturally continued even in the boundary region can be displayed. Accordingly, the cutoff of an image displayed on a screen of the multi-screen display device TDD can be reduced, and a more naturally appearing screen can be implemented.

Thus, in the disclosure, a method for minimizing the non-display region NA of the display device DD (particularly, the display panel DP) will be proposed through embodiments which will be described later.

Figure 6A:
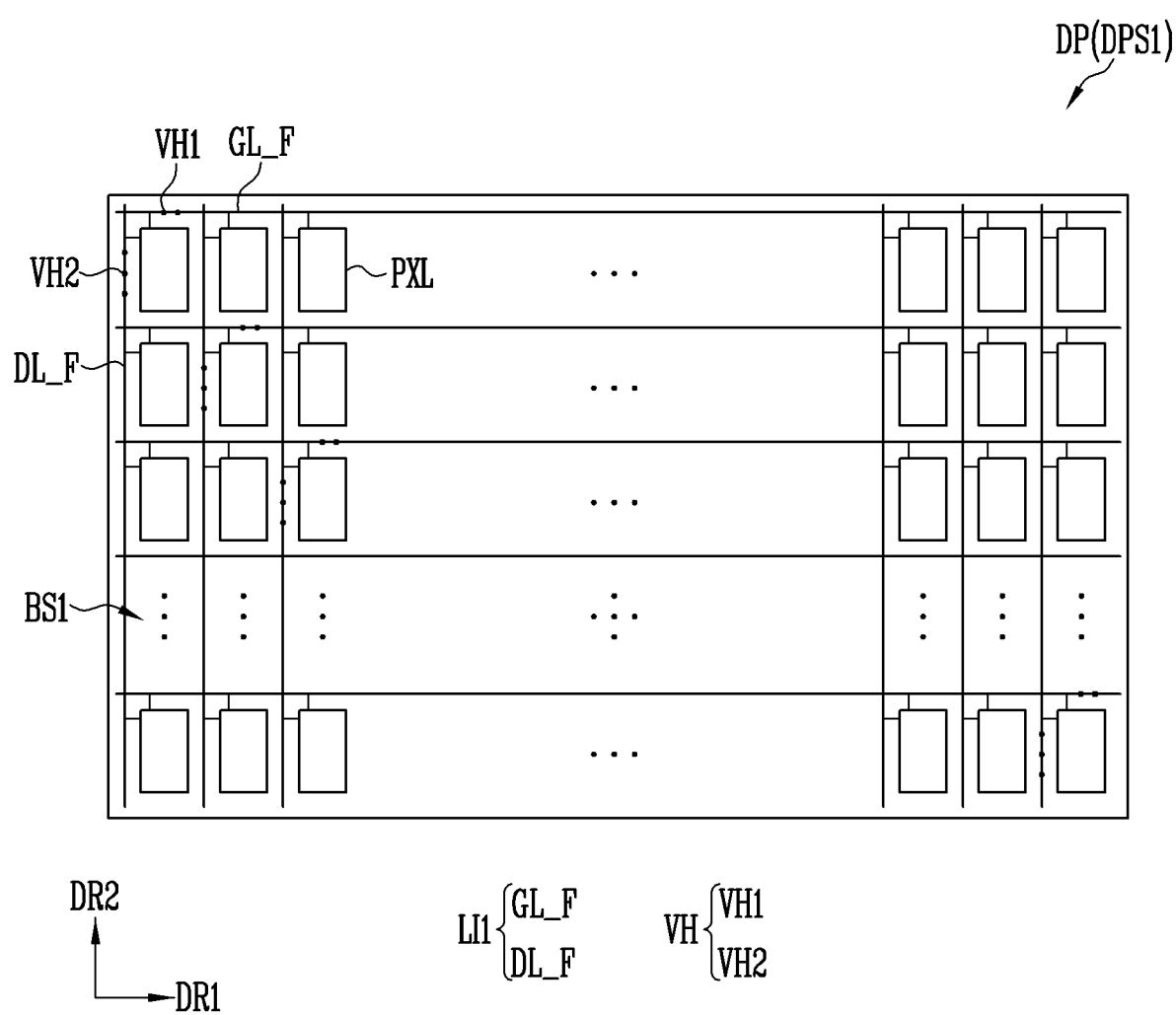
FIGS. 6A and 6B are schematic plan views illustrating a display panel in accordance with an embodiment of the disclosure.
Figure 6B:
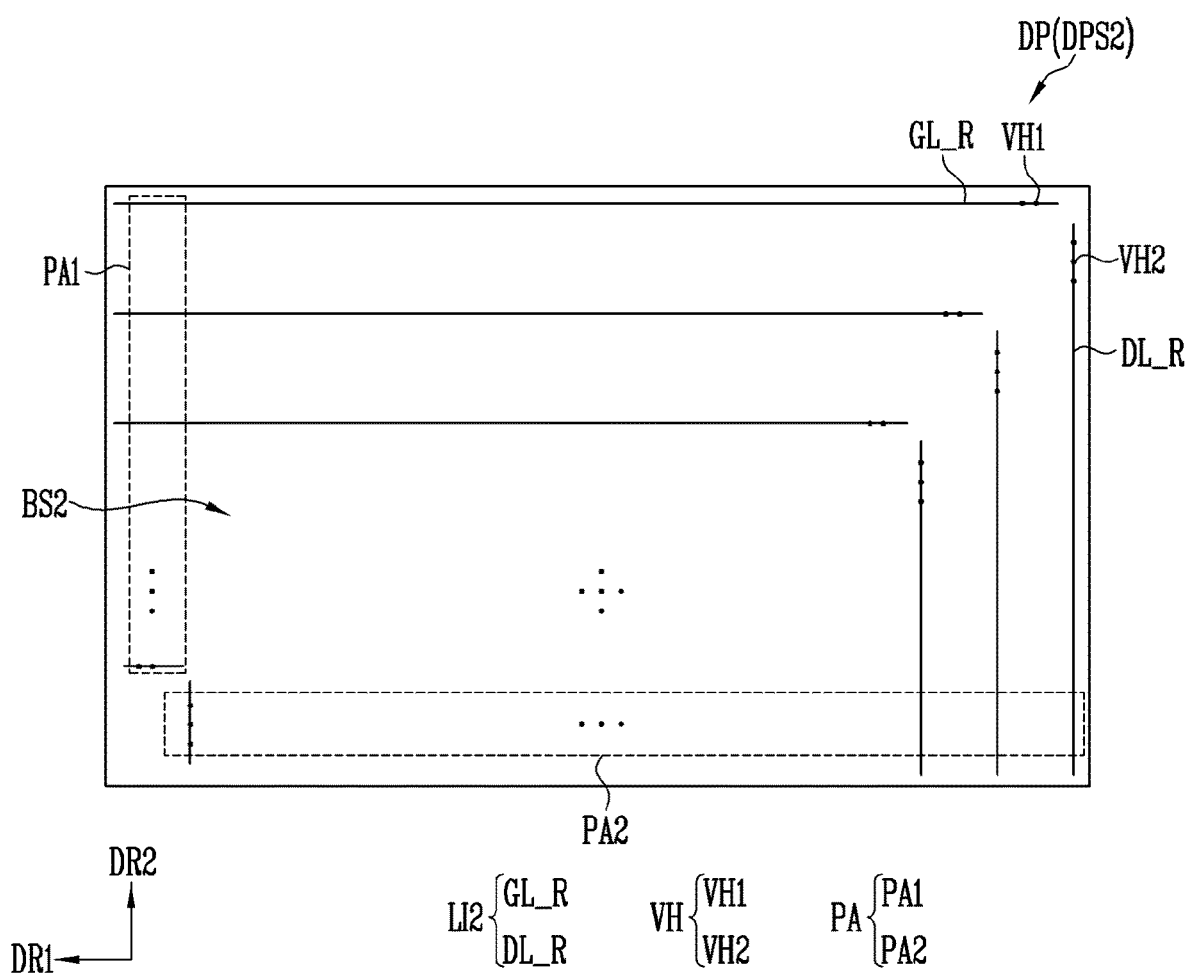

FIGS. 6A and 6B are schematic plan views illustrating a display panel DP in accordance with an embodiment of the disclosure. In an example, FIGS. 6A and 6B respectively represent a first surface DPS1 and a second surface DPS2 of the display panel DP. The first surface DPS1 of the display panel DP may be a display surface on which an image may be displayed, and may be a front surface of the display panel DP. The first surface DPS1 of the display panel DP may include a display region (DA shown in FIG. 1) in which pixels PXL may be arranged. The second surface DPS2 of the display panel DP may be a non-display surface on which the image may not be displayed, and may be a rear surface of the display panel DP. The second surface DPS2 of the display panel DP may be a region covered by a case, etc.

In the case of the display panel DP shown in FIGS. 6A and 6B, it can be seen that, as a non-display region (NA shown in FIG. 1) may be minimized (e.g., reduced or removed) on the first surface DPS1 of the display panel DP in accordance with an embodiment of the disclosure, the entire region except an outermost edge region in the first surface DPS1 of the display panel DP actually corresponds to the display region DA. Therefore, the display region DA and the non-display region NA will be displayed without being distinguished from each other in FIGS. 6A and 6B.

Although a case where first lines LI1 and second lines LI2, which may be disposed on the first surface DPS1 and the second DPS2 of the display panel DP has a form in the first lines LI1 and the second lines LI2 may be symmetrical to each other is illustrated in FIGS. 6A and 6B, this may be caused by a difference between a point of view when the display panel DP is viewed from the top and a point of view when the display panel DP is viewed from the bottom. For example, a left region of the first surface DPS1 of the display panel DP in FIG. 6A may be a region corresponding to (e.g., overlapping) a right region of the second surface DPS2 of the display panel DP in FIG. 6B.

Referring to FIGS. 1 to 6A, the first surface DPS1 of the display panel DP may correspond to a first surface BS1 (e.g., an upper surface) of the base layer BSL, and may include pixels PXL and first lines LI1, which may be disposed on the first surface BS1 of the base layer BSL. For example, the pixels PXL arranged according to a rule and the first lines LI1 connected to the pixels PXL may be formed on the first surface BS1 of the base layer BSL.

In some embodiments, the first lines LI1 may inclusively mean lines disposed on the first surface DPS1 of the display panel DP. For example, the first lines LI1 may include first gate lines GL_F (also, referred to as "gate lines") and first data lines DL_F (also, referred to as "front data lines"), which may be connected to the pixels PXL, to drive the pixels PXL. In addition, the first lines LI1 may further include power lines for supplying a driving power source to the pixels PXL. In an example, the first lines LI1 may further include a first front power line and a second front power line, which may be used to respectively supply a high-potential pixel power source and a low-potential pixel power source to the pixels PXL.

The first gate lines GL_F may extend along a first direction DR1, and be sequentially arranged along a second direction DR2. In an embodiment, the first direction DR1 may be a row direction (or a lateral or horizontal direction), and the second direction DR2 may be a column direction (or a longitudinal or vertical direction). However, the disclosure is not limited thereto.

The first gate lines GL_F may include scan lines connected to pixels PXL of each pixel row (horizontal line). In addition, the first gate lines GL_F may selectively further include other control lines (e.g., front sensing signal lines) for controlling a driving timing of the pixels PXL.

The first data lines DL_F may extend along a direction different from the first gate lines GL_F, and intersect the first gate lines GL_F. For example, the first data lines DL_F may extend along the second direction DR2, and be sequentially arranged along the first direction DR1. The first data lines DL_F may include data lines connected to pixels PXL of each pixel column (vertical line).

In the disclosure, the extending directions and/or arrangement structures of the first gate lines GL_F and the first data lines DL_F are not particularly limited, and this may be variously changed in some embodiments. In an example, the extending/arrangement directions of the first gate lines GL_F and the first data lines DL_F may be reversely changed, or at least one of the first gate lines GL_F and the first data lines DL_F may be formed in a mesh structure.

In some embodiments, the first lines LI1 may further include other signal lines substantially disposed in parallel to the first data lines DL_F. In an example, the first lines LI1 may further include front sensing lines which extend along the second direction DR2 and may be sequentially arranged along the first direction DR1, like the first data lines DL_F.

In some embodiments, at least one via hole VH may be formed in each first gate line GL_F and each first data line DL_F. For example, at least one first via hole VH1 may be formed in each of the first gate line GL_F, and a second via hole VH2 may be formed in each first data line DL_F. The via holes VH may be formed to be connected to each first gate line GL_F or each first data line DL_F in a region in which the via holes VH overlap the first gate line GL_F or the first data line DL_F.

A number of first via holes VH1 formed in each first gate line GL_F and a number of second via holes VH2 formed in each first data line DL_F may be equal to or different from each other. In an example, two first via holes VH1 may be formed in each first gate line GL_F, and three second via holes VH2 may be formed in each first data line DL_F.

Although an embodiment in which a plurality of first or second via holes VH1 or VH2 may be formed in each first gate line GL_F or each first data line DL_F, and the plurality of first or second via holes VH1 or VH2 may be disposed adjacent to each other has been disclosed in FIG. 6A, the disclosure is not limited thereto. For example, the arrangement structure and/or positions of the via holes VH may be variously changed in some embodiments.

Referring to FIG. 6B, the second surface DPS2 of the display panel DP corresponds to a second surface BS2 (e.g., a lower surface) of the base layer BSL, and may include second lines LI2 disposed on the second surface BS2 of the base layer BSL and a pad region PA exposing one region of the second lines LI2. The second lines LI2 may be formed and/or disposed to correspond to the first lines LI1 disposed on the first surface BS1 of the base layer BSL. In an example, each of the second lines LI2 may be formed at a position corresponding to any one first line LI1 so as to be connected to the one first line LI1.

In some embodiments, the second lines LI2 may include lines disposed on the second surface DPS2 of the display panel DP. Each of the second lines LI2 may be connected to any one first line LI1 through at least one via hole VH. For example, each second line LI2 may overlap any one first line LI1 corresponding to at least one via hole VH in a region including the at least one via hole VH, and may be connected to the one first line LI1 through the at least one via hole VH.

The second lines LI2 may include second gate lines GL_R (also, referred to as "rear gate lines") and second data lines DL_R (also, referred to as "read data lines"). Each of the second gate lines GL_R may be connected to each first gate line GL_F through at least one first via hole VH1, and each of the second data lines DL_R may be connected to each first data line GL_F through at least one second via hole VH2.

In an example, each second gate line GL_R may overlap any one first gate line GL_F corresponding to at least one first via hole VH1 in a region in which the at least one first via hole VH1 may be formed, and be connected to the one first gate line GL_F through the at least one first via hole VH1. Similarly, each second data line DL_R may overlap any one first data line DL_F corresponding to at least one second via hole VH2 in a region in which the at least one second via hole VH2 may be formed, and be connected to the one first data line DL_F through the at least one second via hole VH2.

In addition, the second lines LI2 may further include power lines for supplying a driving power source to the pixels PXL and/or additional signal lines for detecting characteristic information of the pixels PXL. In an example, the second lines LI2 may further include a first rear power line connected to the first front power line, a second rear power line connected to the second front power line, and/or rear sensing lines connected to the front sensing lines.

The second lines LI2 may be connected to each driving circuit (e.g., a gate driver or a data driver) in a pad region PA. For example, the second gate lines GL_R may be connected to a first connection film (e.g., the first connection film having a COF form) on which the gate driver may be mounted through a first pad region PA1, and the second data lines DL_R may be connected to a second connection film (e.g., the second connection film having a COF form) on which the data driver (and/or a sensing unit) may be mounted through a second pad region PA2. In case that the second lines LI2 further include first and second rear power lines, the first and second rear power lines may be connected to a power driver through another pad region (not shown).

In an embodiment, the first connection film and the second connection film may be separate connection films separated from each other, but the disclosure is not limited thereto. For example, in another embodiment, the gate driver and the data driver may be mounted together on one connection film.

The pad region PA may include the first pad region PA1 corresponding to the second gate lines GL_R and the second pad region PA2 corresponding to the second data lines DL_R. In case that the second lines LI2 further include additional rear lines (e.g., first and second rear power lines and/or rear sensing lines), in addition to the second gate lines GL_R and the second data lines DL_R, the pad region PA may further include a pad region corresponding to the additional rear lines.

In accordance with the above-described embodiment, the first lines LI1 formed on the first surface BS1 of the base layer BSL may be connected to the second lines LI2 formed on the second surface BS2 of the base layer BSL through the via holes VH penetrating the base layer BSL. In addition, each of the second lines LI2 may be connected to the driving circuit through the pad region PA formed on the second surface BS2 of the base layer BSL.

In the embodiment shown in FIGS. 6A and 6B, the via holes VH may be distributed and disposed in the display region DA in which the pixels PXL may be arranged. In an example, the via holes VH may be substantially uniformly distributed on the first surface BS1 and the second surface BS2 of the base layer BSL. Accordingly, physical impact according to formation of the via holes VH can be distributed and reduced, and the device strength of the display panel DP can be improved. Further, in case that the via holes VH are disposed in the display region DA, the non-display region NA of the display device DD on the display surface, e.g., the first surface DPS1 of the display panel DP can be minimized.

Also, in the above-described embodiment, the pad region PA and/or the connection films connected thereto may be provided on the second surface BS2 of the base layer BSL to overlap the display region DA. When viewed with respect to the first surface DPS1 of the display panel DP, the non-display region NA of the display device DD can be substantially removed or reduced. Accordingly, the non-display region NA of the display device DD can be minimized.

When a multi-screen display device TDD may be configured by using display devices DD in which the non-display region NA may be minimized in this manner, a seam region which may be formed between the display devices DD can be reduced or removed, and an image naturally continued even in a boundary region between the display devices can be displayed. Accordingly, the multi-screen display device TDD having various sizes can be easily fabricated by using the display devices DD.

In an example, in case that a supersized display device of 110 inches or more is fabricated, i.e., in case that a multi-screen display device TDD including a screen of the corresponding area may be fabricated by using the display devices DD in which the non-display region NA may be minimized in accordance with an embodiment of the disclosure, the supersized display device can be more easily fabricated at lower cost, as compared with a case of a single supersized display device including a screen with the same area. Further, in case that an embodiment of the disclosure is applied, viewing of the boundary region between the display devices DD constituting the multi-screen display device TDD can be reduced or prevented, and thus a more natural screen can be implanted even in the multi-screen display device TDD.

Figure 7A:
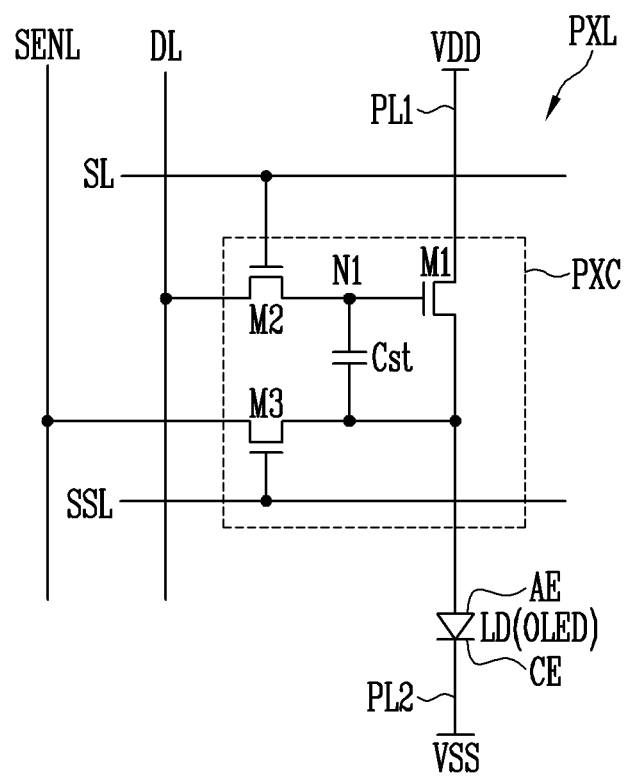
FIGS. 7A to 7C are schematic circuit diagrams each illustrating a pixel in accordance with an embodiment of the disclosure.
Figure 7B:
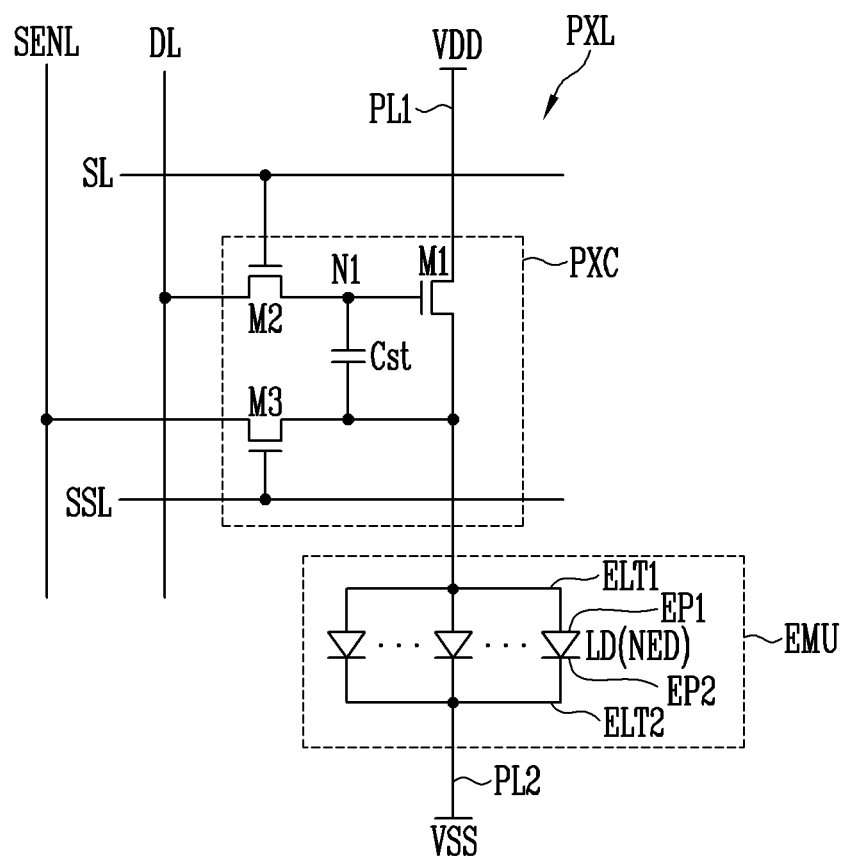
Figure 7C:
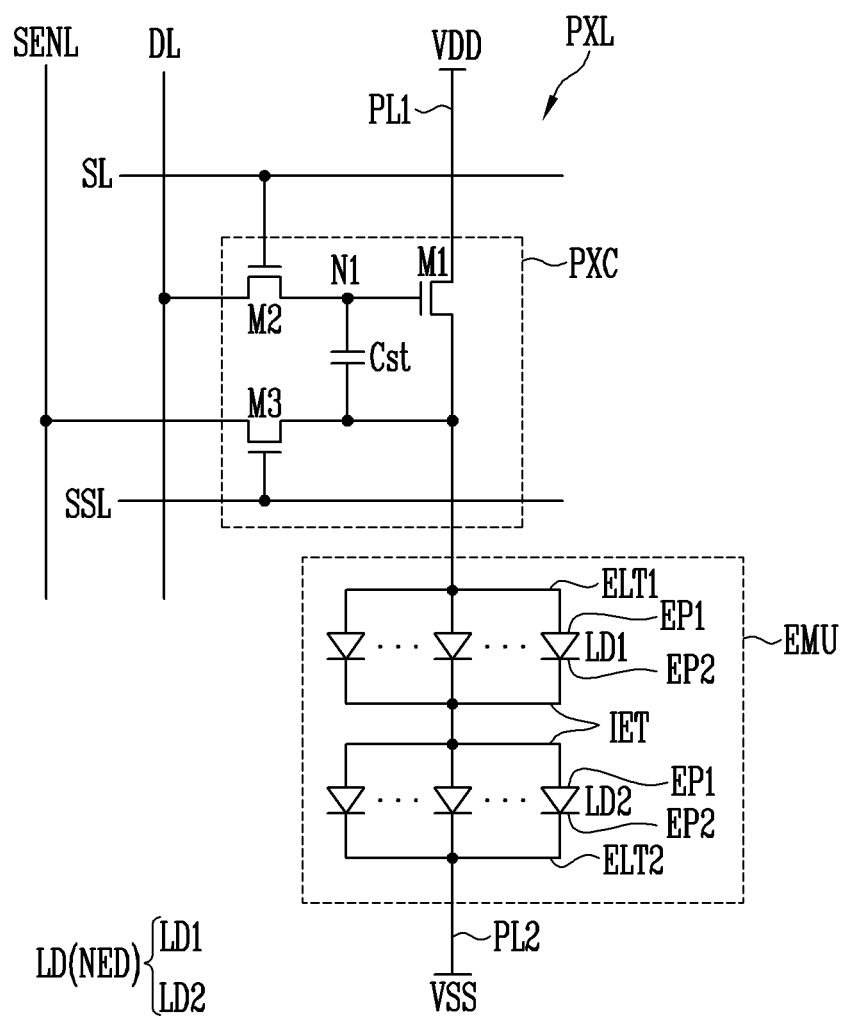

FIGS. 7A to 7C are schematic circuit diagrams each illustrating a pixel PXL in accordance with an embodiment of the disclosure. FIGS. 7A to 7C illustrate different embodiments of a pixel PXL including at least one light emitting element LD. In an example, FIG. 7A illustrates an embodiment of a pixel PXL including an organic light emitting diode OLED as the light emitting element LD, and FIGS. 7B and 7C each illustrate embodiments of the pixel PXL including a plurality of inorganic light emitting diodes NED as the light emitting element LD.

Referring to FIG. 7A, the pixel PXL may include an organic light emitting diode OLED connected between a first power source VDD and a second power source VSS, and may selectively further include a pixel circuit PXC for driving the organic light emitting diode OLED.

The pixel circuit PXC may be connected between the first power source VDD and the organic light emitting diode OLED. Also, the pixel circuit PXC may be connected to a scan line SL and a data line DL of the corresponding pixel PXL, to control an operation of the organic light emitting diode OLED, corresponding to a scan signal and a data signal respectively supplied from the scan line SL and the data line DL. Also, the pixel circuit PXL may be selectively further connected to a sensing signal line SSL and a sensing line SENL.

In should be noted that the term "connection (or coupling)" may inclusively mean physical and/or electrical connection (or coupling). Also, this may inclusively mean direct or indirect connection (or coupling) and integral or non-integral connection (or coupling).

The pixel circuit PXC may include at least one transistor and a capacitor. For example, the pixel circuit PXC may include a first transistor M1, a second transistor M2, a third transistor M3, and a storage capacitor Cst.

The first transistor M1 may be connected between the first power source VDD and a first electrode AE (e.g., an anode electrode) of the organic light emitting diode OLED. In addition, a gate electrode of the first transistor M1 may be connected to a first node N1. The first transistor M1 may control a driving current supplied to the organic light emitting diode OLED, corresponding to a voltage of the first node N1. For example, the first transistor M1 may be a driving transistor which controls a driving current of the pixel PXL.

In an embodiment, the first transistor M1 may selectively further include a back gate electrode. The gate electrode and the back gate electrode of the first transistor M1 may overlap each other with an insulating layer disposed (e.g., interposed) therebetween.

The second transistor M2 may be connected between the data line DL and the first node N1. In addition, a gate electrode of the second transistor M2 may be connected to the scan line SL. The second transistor M2 may be turned on in case that a scan signal having a gate-on voltage (e.g., a high level voltage) may be supplied from the scan line SL, to electrically connect the data line DL and the first node N1.

A data signal of a corresponding frame may be supplied to the data line DL for each frame period. The data signal may be transferred to the first node N1 through the second transistor M2 turned on during a period in which the scan signal having the gate-on voltage may be supplied. For example, the second transistor M2 may be a switching transistor for transferring each data signal to the inside of the pixel PXL.

One electrode of the storage capacitor Cst may be connected to the first node N1, and the other electrode of the storage capacitor Cst may be connected to a second electrode of the first transistor M1. The storage capacitor Cst may charge a voltage corresponding to the data signal supplied to the first node N1 during each frame period.

The third transistor M3 may be connected between the first electrode AE of the organic light emitting diode OLED (or the second electrode of the first transistor M1) and the sensing line SENL. In addition, a gate electrode of the third transistor M3 may be connected to the sensing signal line SSL. The third transistor M3 may transfer, to the sensing line SENL, a voltage value applied to the first electrode AE of the organic light emitting diode OLED according to a sensing signal supplied to the sensing signal line SSL during a sensing period. The voltage value transferred through the sensing line SENL may be provided to an external circuit (e.g., a timing controller), and the external circuit may extract characteristic information (e.g., a threshold voltage of the first transistor M1, etc.) of the pixel PXL, based on the provided voltage value. The extracted characteristic information may be used to convert image data such that a characteristic difference between the pixels PXL may be compensated.

Although a case where the transistors, e.g., the first, second, and third transistors M1, M2, and M3, which may be included in the pixel circuit PXC, may be all N-type transistors has been illustrated in FIG. 7A, the disclosure is not limited thereto. For example, at least one of the first, second, and third transistors M1, M2, and M3 may be changed to a P-type transistor. In an example, the pixel circuit PXC may include a combination of P-type and N-type transistors.

In addition, the structure and driving method of the pixel PXL may be variously modified. For example, the pixel circuit PXC may be configured as a pixel circuit having various structures and/or various driving methods, in addition to the embodiment shown in FIG. 7A.

In an example, the pixel circuit PXC may not include the third transistor M3. Also, the pixel circuit PXC may further include other circuit elements such as a compensation transistor for compensating for a threshold voltage of the first transistor M1, etc., an initialization transistor for initializing a voltage of the first node N1 or the first electrode AE of the organic light emitting diode OLED, an emission control transistor for controlling a period in which a driving current may be supplied to the organic light emitting diode OLED, and/or a boosting capacitor for boosting the voltage of the first node N1.

In another embodiment, in case that the pixel PXL is a pixel of a passive light emitting display device, the pixel circuit PXC may be omitted. The first electrode AE and a second electrode CE of the organic light emitting diode OLED may be directly connected to the scan line SL, the data line DL, a first power line PL1, a second power line PL2, and/or another signal line, another power line, or the like.

The organic light emitting diode OLED may include the first electrode AE connected to the first power source VDD through the pixel circuit PXC and the first power line PL1, and the second electrode CE connected to the second power source VSS through the second power line PL2. Also, the organic light emitting diode OLED may include an organic emitting layer interposed between the first electrode AE and the second electrode CE.

The first power source VDD and the second power source VSS may have different potentials such that the organic light emitting diode OLED can emit light. In an example, the first power source VDD may be set as a high-potential power source, and the second power source VSS may be set as a low-potential power source. The first electrode AE of the organic light emitting diode OLED may be an anode electrode, and the second electrode CE of the organic light emitting diode OLED may be a cathode electrode.

The organic light emitting diode OLED may generate light with a luminance corresponding to a driving current in case that the driving current is supplied from the pixel circuit PXC. Accordingly, each pixel PXL may emit light with a luminance corresponding to the data signal supplied to the first node N1 during each frame period. In case that a data signal corresponding to a black grayscale is supplied to the first node N1 during the corresponding frame period, the pixel circuit PXC may not supply the driving current to the organic light emitting diode OLED, and accordingly, the pixel PXL can maintain a non-emission state during the corresponding frame period.

Referring to FIG. 7B, the pixel PXL may include a light emitting part EMU including at least one inorganic light emitting diode NED connected between the first power source VDD and the second power source VSS. In an example, the light emitting part EMU may include a plurality of nano-scale inorganic light emitting diodes NED connected in parallel to each other between the pixel circuit PXC and the second power source VSS.

For example, the light emitting part EMU may include a first electrode ELT1 (also, referred to as a "first pixel electrode" or a "first alignment electrode") connected to the first power source VDD via the pixel circuit PXC and the first power line PL1, a second electrode ELT2 (also, referred to as a "second pixel electrode" or a "second alignment electrode") connected to the second power source VSS through the second power line PL2, and a plurality of inorganic light emitting diodes NED connected between the first and second electrodes ELT1 and ELT2. In some embodiments, the first electrode ELT1 of the light emitting part EMU may be an anode electrode, and the second electrode ELT2 of the light emitting part EMU may be a cathode electrode. However, the disclosure is not limited thereto.

In an embodiment, the light emitting part EMU may include a plurality of inorganic light emitting diodes NED connected in parallel to each other in the same direction between the first electrode ELT1 and the second electrode ELT2. For example, each inorganic light emitting diode NED may include a first end portion EP1 (e.g., a P-type end portion) connected to the first power source VDD through the first electrode ELT1 and/or the pixel circuit PXC and a second end portion EP2 (e.g., an N-type end portion) connected to the second power source VSS through the second electrode ELT2. For example, the inorganic light emitting diodes NED may be connected in parallel to each other in a forward direction between the first and second electrodes ELT1 and ELT2.

Although an embodiment in which the pixel PXL includes the light emitting part EMU having a parallel structure has been disclosed in FIG. 7B, the disclosure is not limited thereto. For example, the pixel PXL may include a light emitting part EMU having a serial structure or a series/parallel structure. The light emitting part EMU may include inorganic light emitting diodes NED connected in a serial structure or a series/parallel structure between the first electrode ELT1 and the second electrode ELT2. In an example, the light emitting part EMU may include a plurality of inorganic light emitting diodes NED divided into two serial stages to be connected to each other as illustrated in the embodiment shown in FIG. 7B.

Referring to FIG. 7C, the light emitting part EMU may include a first electrode ELT1, a second electrode ELT2, and a plurality of inorganic light emitting diodes NED connected in a series/parallel structure between the first and second electrodes ELT1 and ELT2.

In an example, the light emitting part EMU may include a first electrode ELT1, a second electrode ELT2, and at least one intermediate electrode IET connected between the first and second electrodes ELT1 and ELT2. Some of the inorganic light emitting diodes NED may be connected in the forward direction between the first electrode ELT1 and the intermediate electrode IET, and the others of the inorganic light emitting diodes NED may be connected in the forward direction between the intermediate electrode IET and the second electrode ELT2. Accordingly, the inorganic light emitting diodes NED may be connected in series/parallel to each other between the first electrode ELT1 and the second electrode ELT2.

For example, at least one first inorganic light emitting diode LD1 may be connected between the first electrode ELT1 and the intermediate electrode IET. The first inorganic light emitting diode LD1 may include a P-type first end portion EP1 connected to the first electrode ELT1 and an N-type second end portion EP2 connected to the intermediate electrode IET.

At least one second inorganic light emitting diode LD2 may be connected between the intermediate electrode IET and the second electrode ELT2. The second inorganic light emitting diode LD2 may include a P-type first end portion EP1 connected to the intermediate electrode IET and an N-type second end portion EP2 connected to the second electrode ELT2. In some embodiments, a number of second inorganic light emitting diodes LD2 may be equal to or different from that of first inorganic light emitting diodes LD1.

Although the light emitting part having a two-stage series/parallel structure has been disclosed in FIG. 7C, the disclosure is not limited thereto. For example, the light emitting part EMU may be configured in a three or more-stage serial structure and/or a series/parallel hybrid structure.

When assuming that the light emitting part EMU is configured by using, as effective light sources, inorganic light emitting diodes NED under the same condition (e.g., the same size and/or the same number), power efficiency can be improved in case that the inorganic light emitting diodes NED may be connected in a serial structure or a series/parallel hybrid structure. For example, in a light emitting part (e.g., the light emitting part EMU shown in FIG. 7C) in which inorganic light emitting diodes NED may be connected in series or series/parallel, a high luminance may be expressed by using the same current, as compared with a light emitting part (e.g., the light emitting part EMU shown in FIG. 7B) in which the inorganic light emitting diodes NED may be connected only in parallel. Also, in a light emitting part in which inorganic light emitting diodes NED may be connected in series or series/parallel, the same luminance may be expressed by using a low driving current, as compared with a light emitting part in which the inorganic light emitting diodes NED may be connected in parallel.

In the pixel PXL in which the inorganic light emitting diodes NED may be connected in a series structure or a series/parallel hybrid structure, although a short failure may occur in some serial stages, a luminance can be expressed through inorganic light emitting diodes NED of the other serial stage. Hence, the probability that a dark spot failure will occur in the pixel PXL can be reduced.

In the embodiments shown in FIGS. 7B and 7C, each of the inorganic light emitting diodes NED may include a first end portion (e.g., a P-type end portion) connected to the first power source VDD via a first pixel electrode (e.g., the first electrode ELT1), the pixel circuit PXC, and/or the first power line PL1, and a second end portion (e.g., an N-type end portion) connected to the second power source VSS via a second pixel electrode (e.g., the second electrode ELT2) and the second power line PL2. For example, the inorganic light emitting diodes NED may be connected in the forward direction between the first power source VDD and the second power source VSS.

The inorganic light emitting diodes NED connected in the forward direction between the first power source VDD and the second power source VSS may constitute effective light sources, respectively. In addition, these effective light sources may constitute the light emitting part EMU of the pixel PXL.

When a driving current is supplied through a corresponding pixel circuit PXC, the inorganic light emitting diodes NED emit light with a luminance corresponding to the driving current. For example, during each frame period, the pixel circuit PXC may supply, to the light emitting part EMU, a driving current corresponding to a grayscale value to be expressed in a corresponding frame. Accordingly, the light emitting part EMU can express a luminance corresponding to the driving current while the inorganic light emitting diodes NED emit light with the luminance corresponding to the driving current.

In an embodiment, the light emitting part EMU may further include at least one non-effective light source in addition to the inorganic light emitting diodes NED constituting the respective effective light sources. In an example, at least one non-effective light emitting element which may be arranged in a reverse direction or has at least one end portion that may be floated may be further connected in at least one serial stage. The non-effective light emitting element may maintain an inactivated state even in case that a driving voltage (e.g., a forward driving voltage) may be applied between the first and second electrodes ELT1 and ELT2. Accordingly, the non-effective light emitting element may substantially maintain the non-emission state.

Figure 8A:
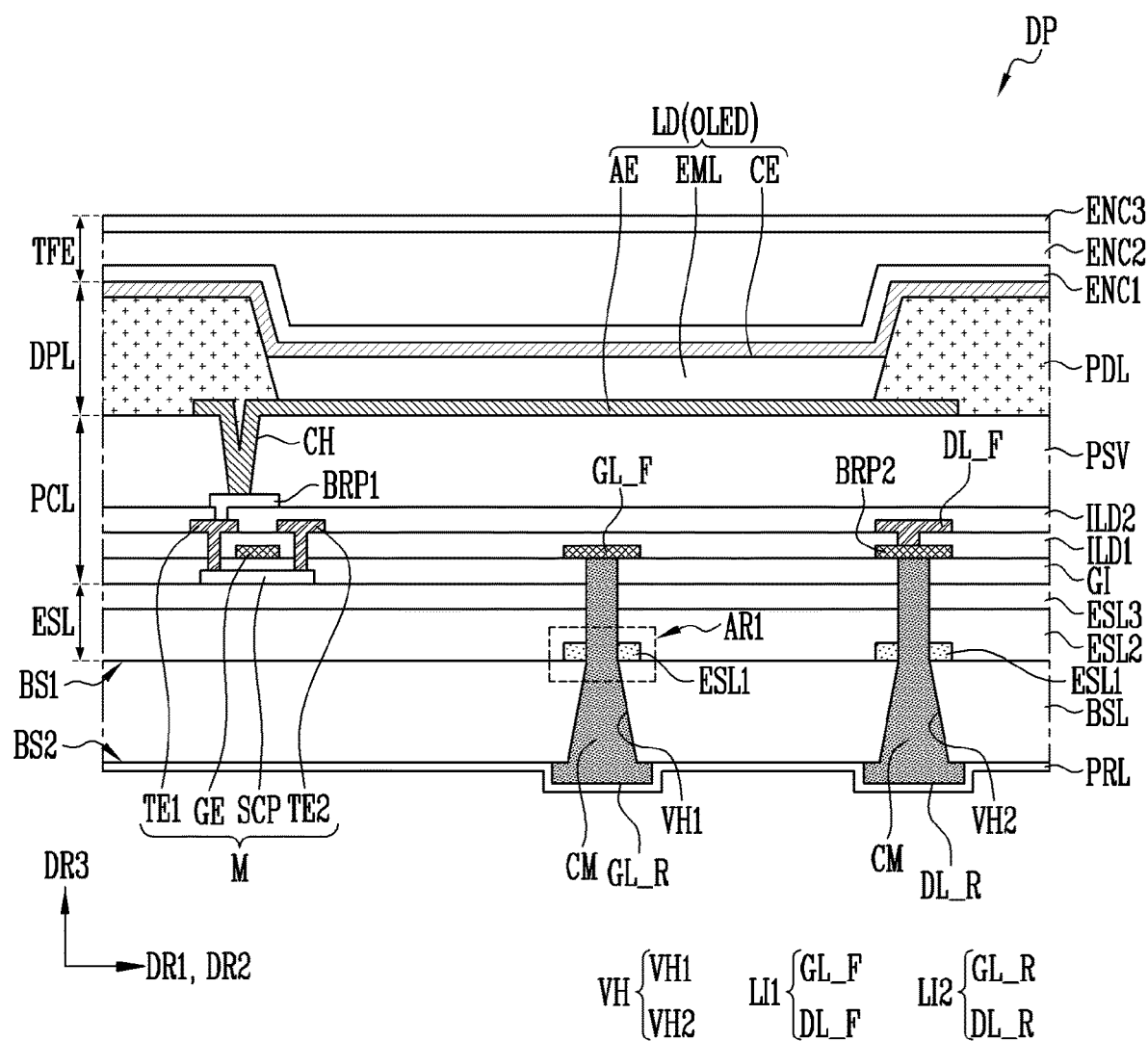
FIGS. 8A to 8D are schematic sectional views each illustrating a display panel in accordance with an embodiment of the disclosure.

FIGS. 8A to 8D are schematic sectional views each illustrating a display panel DP in accordance with an embodiment of the disclosure. FIG. 9 is a schematic plan view illustrating region AR1 shown in FIG. 8A. FIG. 8A illustrates a section of the display panel DP, based on one region of a pixel PXL including an organic light emitting diode OLED as illustrated in the embodiment shown in FIG. 7A, and FIGS. 8B to 8D illustrate a section of the display panel DP, based on one region of a pixel PXL including an inorganic light emitting diode LD as illustrated in the embodiment shown in FIG. 7B.

In FIGS. 8A to 8D, a transistor M (e.g., the first transistor M1 shown in FIGS. 7A to 7C) connected to a first electrode ELT1 through each contact hole CH and/or a first bridge pattern BRP1 is illustrated as an example of circuit elements which may be disposed in a pixel circuit layer PCL, and any one first gate line GL_F and any one first data line DL_F, which may be disposed in each pixel region and/or a peripheral region thereof, are illustrated as an example of a line which may be disposed in the pixel circuit layer PCL.

Although illustration of first and second power lines PL1 and PL2 for supplying first and second power sources VDD and VSS to pixels PXL is omitted in FIGS. 8A to 8D, the first and second power lines PL1 and PL2 (particularly, first and second front power lines) may also be disposed in the pixel circuit layer PCL, like the first gate line GL_F and the first data line DL_F. In an example, the first and second power lines PL1 and PL2 may be disposed in the pixel circuit layer PCL, to be connected to a light emitting element LD of each of the pixels PXL through each pixel circuit PXC and/or at least one contact hole. Also, the first and second power lines PL1 and PL2 may be connected to a second surface BS2 from a first surface BS1 of a base layer BSL in the same manner as the first gate line GL_F and the first data line DL_F, and be connected to a power supply through a pad region formed on the second surface BS2.

Referring to FIGS. 1 to 9, the display panel DP may include a pixel circuit layer PCL, a display element layer DPL, and a thin film encapsulation layer TFE, which may be sequentially disposed on the first surface BS1 of the base layer BSL. However, the positions of the pixel circuit layer PCL, the display element layer DPL, and/or the thin film encapsulation layer TFE may be changed in some embodiments.

Also, the display panel DP may further include a multi-layered etch stopper layer ESL disposed on the first surface BS1 of the base layer BSL to be interposed between the base layer BSL and first line LI1, via holes VH penetrating the multi-layered etch stopper layer ESL and the base layer BSL, and second lines LI2 which may be disposed on the second surface BS2 of the base layer BSL and may be connected to the first lines LI1 by the via holes VH. Additionally, the display panel DP may further include a protective layer PRL disposed on the second surface BS2 of the base layer BSL to cover the second lines LI2.

The multi-layered etch stopper layer ESL may include at least a first etch stopper layer ESL1 and a second etch stopper layer ESL2. Also, the multi-layered etch stopper layer ESL may further include a third etch stopper layer ESL3.

The first etch stopper layer ESL1 may be disposed on the first surface BS1 of the base layer BSL to surround each via hole VH. The first etch stopper layer ESL1 may include at least one inorganic layer (e.g., an inorganic insulating layer). In an example, the first etch stopper layer ESL1 may be configured with a single-layered inorganic layer or be configured with multi-layered inorganic layers.

The first etch stopper layer ESL1 may have a size with which the first etch stopper layer ESL1 can cover damage and/or deformation (e.g., a crater) which may occur in the base layer BSL due to laser in a process of forming the via holes VH. In an example, the first etch stopper layer ESL1 may be formed at the periphery of the via holes VH to have an area and/or a thickness enough to sufficiently cover a crater which may occur in the base layer BSL at the periphery of each via hole VH as shown in FIGS. 8A and 9.

For example, in case that the base layer BSL is formed of glass, each via hole VH may be formed by changing a property of the base layer BSL through irradiation of laser onto the base layer BSL corresponding to a region in which the corresponding via hole VH is to be formed and performing wet etching on the base layer BSL in a subsequent process. In case that the laser is irradiated on to the base layer BSL, a crater may occur in a surface of the base layer BSL in each via hole region corresponding to the via holes VH and/or a peripheral region thereof.

The base layer BSL may have a non-flat surface in the region in which the crater occurs. Therefore, in case that a buffer layer and/or the pixel circuit layer PCL may be entirely formed immediately on a surface (e.g., the first surface BS1) of the base layer BSL, in which the crater occurs, lifting or disconnection of an upper layer located on the top of the base layer BSL may occur in the region in which the crater occurs. Accordingly, a layer separation phenomenon may occur while an etchant penetrates into an interface between the upper layer and the base layer BSL in a wet etching process for forming the via holes VH, etc.

In order to prevent problems such as the layer separation phenomenon, in an embodiment of the disclosure, the first etch stopper layer ESL1 may be first formed on the first surface BS1 of the base layer BSL to surround each via hole VH when viewed on at least one plane. In particular, the first etch stopper layer ESL1 may be formed to have an area and/or a thickness enough to sufficiently cover a crater which may occur in the base layer BSL on a plane and/or a section. In an example, a size, etc. of a crater which may occur in the base layer BSL may be experimentally predicted by considering the material of the base layer BSL, the intensity of laser, or the like, and the first etch stopper layer ESL1 may be formed to have a size enough to sufficiently cover the crater.

In an embodiment, the first etch stopper layer ESL1 may be configured with a plurality of separated inorganic layer patterns distributed in the display region DA. For example, the first etch stopper layer ESL1 may include a plurality of inorganic layer patterns which surround each via hole VH and may be separated from each other, and each inorganic layer pattern may have an area and a thickness, enough to sufficiently cover a crater which may occur at the periphery of each via hole VH.

In some embodiments, the first etch stopper layer ESL1 may include an inorganic material which can be etched together with the base layer BSL in an etching process of the base layer BSL, which may be used to form the via holes VH. In an example, in case that the base layer BSL is a glass substrate, the first etch stopper layer ESL1 may include at least one material among silicon nitride (SiNx), silicon oxide (SiOx), and silicon oxynitride (SiOxNy). However, the material forming the first etch stopper layer ESL is not limited thereto, and may be variously changed according to a material forming the base layer BSL, an etching method and condition, or the like.

The first etch stopper layer ESL1 having a size enough to cover a crater of the base layer BSL may be formed by using an inorganic material which can be etched together with the base layer BSL, so that a layer separation phenomenon caused by the crater can be prevented.

The second etch stopper layer ESL2 may be entirely disposed on the first surface BS1 of the base layer BSL including the first etch stopper layer ESL1, and be opened in a region corresponding to the via holes VH. In some embodiments, the second etch stopper layer ESL2 may include at least one organic layer. In an example, the second etch stopper layer ESL2 may be configured with a single-layered organic layer (e.g., an organic insulating layer) or be configured with multi-layered organic layers. In an embodiment, the second etch stopper layer ESL2 may include polyimide, but the disclosure is not limited thereto. For example, the second etch stopper layer ESL2 may include various organic materials, and the material forming the second etch stopper layer ESL2 is not particularly limited.

The second etch stopper layer ESL2 may substantially planarize the top of the first surface BS1 of the base layer BSL, on which the first etch stopper layer ESL1 may be formed, so that a subsequent process can be stably performed. Also, the second etch stopper layer ESL2 may prevent an etchant from penetrating into the second etch stopper layer ESL2 and/or upper layers thereof (e.g., the third etch stopper layer ESL3 and/or the pixel circuit layer) in an etching process of the base layer BSL, so that damage of the display panel DP can be prevented.

The third etch stopper layer ESL3 may be entirely disposed on the second etch stopper layer ESL2, and be opened in a region corresponding to the via holes VH. In some embodiments, the third etch stopper layer ESL3 may include at least one inorganic layer. In an example, the third etch stopper layer ESL3 may be configured with a single-layered inorganic layer or be configured with multi-layered inorganic layers. In an embodiment, the third etch stopper layer ESL3 may include at least one material among silicon nitride (SiNx), silicon oxide (SiOx), and silicon oxynitride (SiOxNy), but the disclosure is not limited thereto. For example, the third etch stopper layer ESL3 may include various inorganic materials, and the material forming the third etch stopper layer ESL3 is not particularly limited.

The third etch stopper layers ESL3 may improve an adhesive force (or bonding force) between the second etch stopper layer ESL2 and the pixel circuit layer PCL, and prevent an impurity from being diffused into the pixel circuit layer PCL on the top thereof. In an example, the third etch stopper layer ESL3 may serve as a buffer layer.

The pixel circuit layer PCL may be disposed on the multi-layered etch stopper layer ESL.

The pixel circuit layer PCL may include pixel elements constituting a pixel circuit PXC for each pixel PXL, and first lines LI1 connected to the pixel circuits PXC and/or light emitting element(s) of the pixels PXL. In an example, the pixel circuit layer PCL may include circuit elements constituting a pixel circuit PXC of each of pixels PXL, and first gate lines GL_F and first data lines DL_F, which may be connected to the circuit elements. Additionally, the pixel circuit layer PCL may further include other kinds of front signal lines connected to the pixels PXL and/or first and second front power lines. The first lines LI1 may further include other kinds of front lines in addition to the first gate lines GL_F and the first data lines DL_F.

Also, the pixel circuit layer PCL may include a plurality of insulating layers in addition to the circuit elements and the first line LI1. For example, the pixel circuit layer PCL may include a gate insulating layer GI, a first interlayer insulating layer ILD1, a second interlayer insulating layer ILD2, and/or a passivation layer PSV, which may be sequentially disposed on the first surface BS1 of the base layer BSL including the multi-layered etch stopper layer ESL.

In some embodiments, a semiconductor layer may be disposed on the multi-layered etch stopper layer ESL. The semiconductor layer may include a semiconductor pattern SCP of each transistor M. The semiconductor pattern SCP may include a channel region overlapping each gate electrode GE, and first and second conductive regions (e.g., source and drain regions) disposed at both sides of the channel region.

The gate insulating layer GI may be disposed on the semiconductor layer. In addition, a first conductive layer may be disposed on the gate insulating layer GI.

The first conductive layer may include a gate electrode GE of each transistor M. Also, the first conductive layer may further include any one electrode of a storage capacitor Cst, at least one first line LI1 (e.g., first gate lines GL_F and/or front sensing signals), and/or a bridge pattern (e.g., a second bridge pattern BRP2 connected between a pair of a first data line DL_F and a second data line DL_R).

The first interlayer insulating layer ILD1 may be disposed on the first conductive layer. In addition, a second conductive layer may be disposed on the first interlayer insulating layer ILD1.

The second conductive layer may include first and second transistor electrodes TE1 and TE2 of each transistor M. The first and second transistor electrodes TE1 and TE2 may be source and drain electrodes. Also, the second conductive layer may further include any one electrode of the storage capacitor Cst and/or at least one first line LI1 (e.g., first data lines DL_F).

The second interlayer insulating layer ILD2 may be disposed on the second conductive layer. In addition, a third conductive layer may be disposed on the second interlayer insulating layer ILD2.

The third conductive layer may include a first bridge pattern BRP1 connecting the pixel circuit layer PCL and the display element layer DPL and/or at least one first line LI1 (e.g., first and second front power lines and/or front sensing lines). The first bridge pattern BRP1 may be connected to a first electrode AE or ELT1 of a light emitting element LD (e.g., an organic light emitting diode OLED or at least one nano-scale inorganic light emitting diode NED) of each pixel PXL through a contact hole CH, etc.

The passivation layer PSV may be disposed on the third conductive layer. In addition, the display element layer DPL may be disposed on the pixel circuit layer PCL including the passivation layer PSV.

The display element layer DPL may include light emitting elements LD of the pixels PXL and/or electrodes connected thereto. In an example, an organic light emitting diode OLED or a plurality of nano-scale inorganic light emitting diodes NED may be disposed in each pixel region of the display element layer DPL.

In an embodiment, in case that the light emitting element LD of the pixel PXL is an organic light emitting diode OLED as illustrated in the embodiment shown in FIG. 7A, the display element layer DPL may include an organic light emitting diode OLED formed in each pixel region as shown in FIG. 8A.

In the embodiment shown in FIG. 8A, the display element layer DPL may include a light emitting element LD formed in each pixel region, and the light emitting element LD may be an organic light emitting diode OLED. The light emitting element LD may include first and second electrodes AE and CE, and an emitting layer EML interposed between the first and second electrodes AE and CE.

One of the first and second electrodes AE and CE may be an anode electrode, and the other of the first and second electrodes AE and CE may be a cathode electrode. In case that the light emitting element LD is a top-emission organic light emitting diode OLED, the first electrode AE may be a reflective electrode, and the second electrode CE may be a transmissive electrode. In an embodiment of the disclosure, a case where the light emitting element LD may be the top-emission organic light emitting diode OLED, and the first electrode AE may be the anode electrode will be described as an example.

The first electrode AE may be connected to a circuit element (e.g., the first transistor M1 shown in FIG. 7A) of the pixel circuit layer PCL through the contact hole CH penetrating the passivation layer PSV and/or the first bridge pattern BRP1. The first electrode AE may include a reflective layer (not shown) capable of reflecting light or a transparent conductive layer (not shown) disposed on the top or the bottom of the reflective layer. In an example, the first electrode AE may be configured with multi-layered conductive layers including a lower transparent conductive layer and an upper transparent conductive layer, which may be made of indium tin oxide (ITO), and a reflective layer which may be provided between the lower transparent conductive layer and the upper transparent conductive layer and may be made of silver (Ag).

The display element layer DPL may further include a pixel defining layer PDL having an opening exposing a portion of the first electrode AE, e.g., a top surface of the first electrode AE. The pixel defining layer PDL may be an organic insulating layer including an organic material. In an example, the pixel defining layer PDL may be configured as an organic insulating layer including at least one of acryl resin, epoxy resin, phenolic resin, polyamide resin, polyimide resin, and the like.

The emitting layer EML may be disposed in a region corresponding to the opening of the pixel defining layer PDL. For example, the emitting layer EML may be disposed on a surface of the exposed first electrode AE. The emitting layer EML may have a multi-layered thin film structure including at least a light generation layer. The emitting layer EML may include a hole injection layer for injecting holes. The emitting layer EML may include a hole transport layer having an excellent hole transporting property, the hole transport layer for increasing the opportunity for holes and electrons to be re-combined by suppressing the movement of electrons that fail to be combined in the light generation layer, the light generation layer for emitting light through the re-combination of the injected electrons and holes. The emitting layer EML may include a hole blocking layer for suppressing the movement of holes that fail to be combined in the light generation layer, an electron transport layer smoothly transporting electrons to the light generation layer, and an electron injection layer for injecting electrons.

The light generation layer may be individually formed in an emission region of each pixel PXL, and the hole injection layer, the hole transport layer, the hole blocking layer, the electron transport layer, and the electron injection layer may be common layers connected in adjacent emission regions. However, in FIG. 8A, the emitting layer EML will be illustrated with respect to the light generation layer.

The second electrode CE may be provided and/or formed on the emitting layer EML. The second electrode CE may be a common layer commonly provided in the pixels PXL, but the disclosure is not limited thereto. The second electrode CE may be a transmissive electrode, and may include a transparent conductive material (or substance). The transparent conductive material (or substance) may include at least one of a transparent conductive oxide such as indium tin oxide (ITO), indium zinc oxide (IZO), zinc oxide (ZnO), or indium tin zinc oxide (ITZO), and a conductive polymer such as PEDOT, but the disclosure is not limited thereto.

Figure 8B:
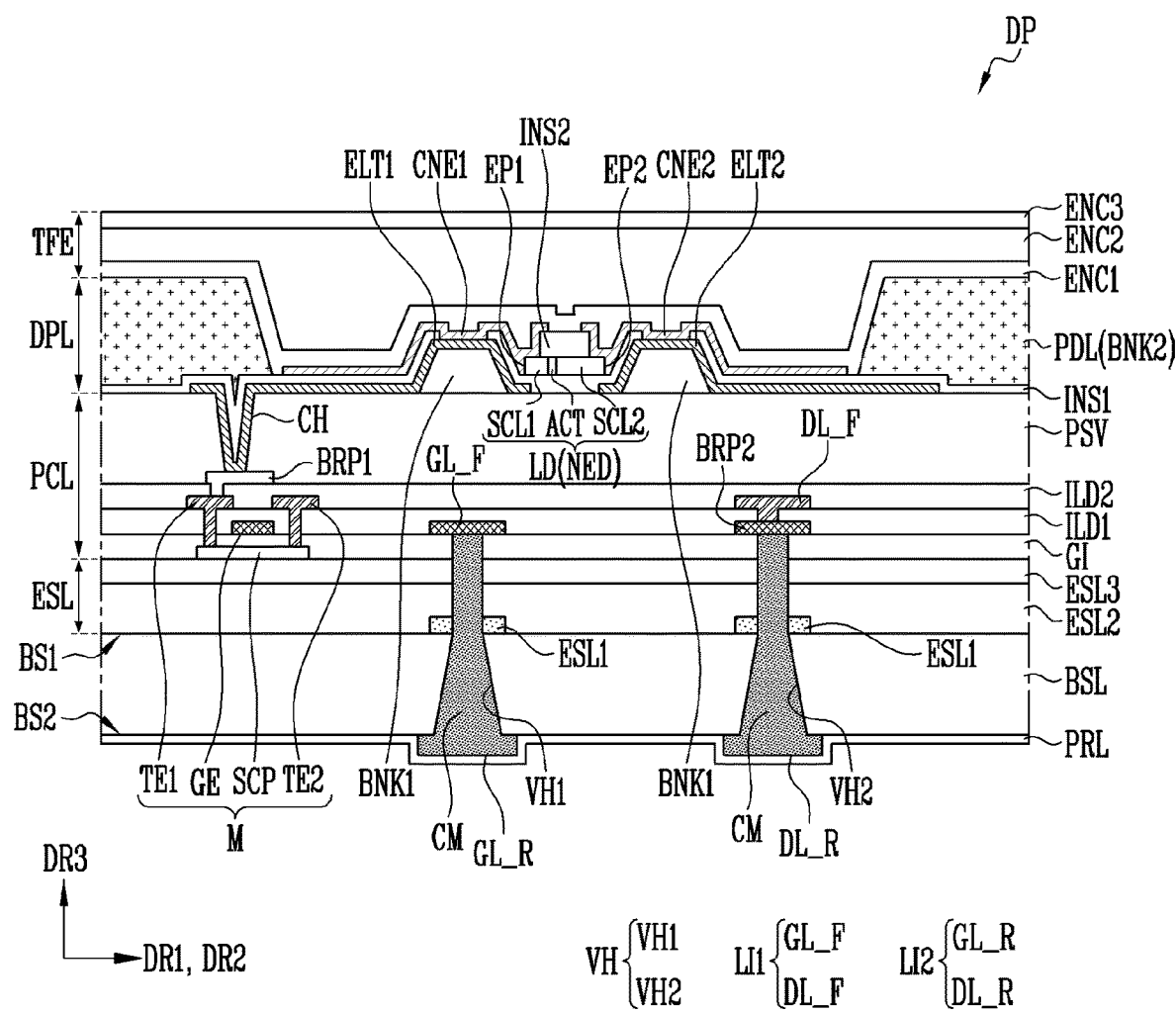
Figure 8C:
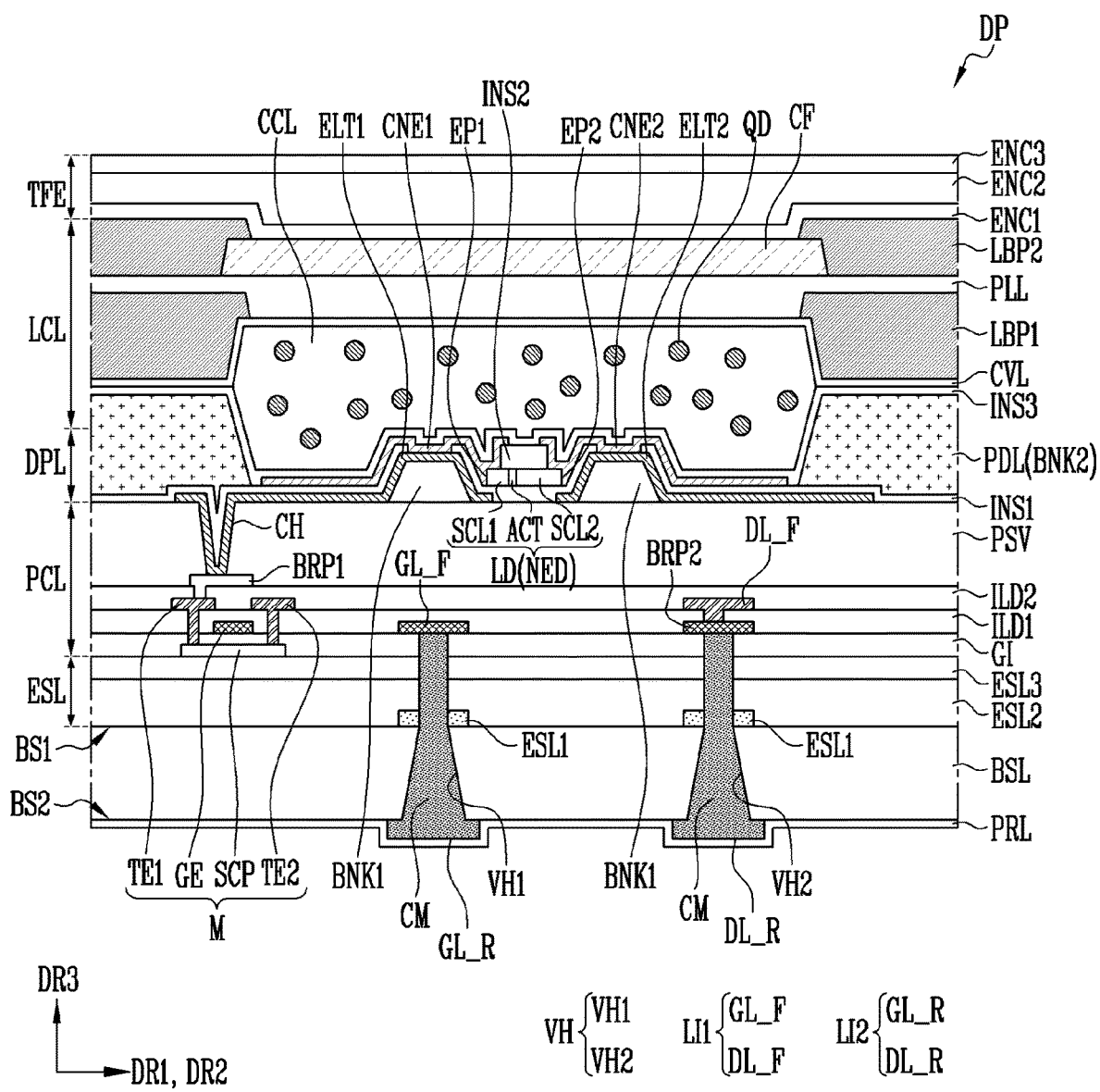
Figure 8D:
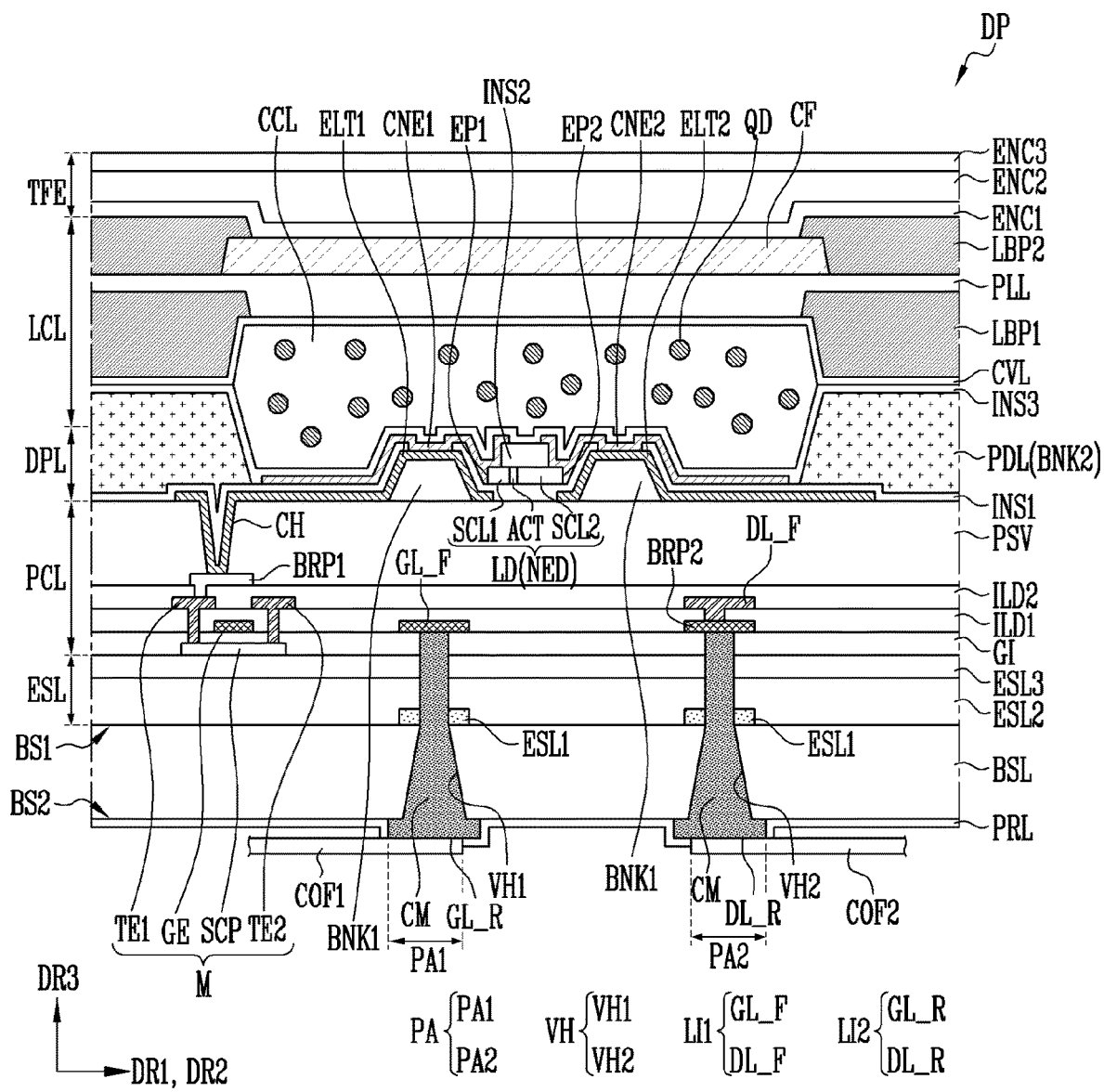
Figure 9:
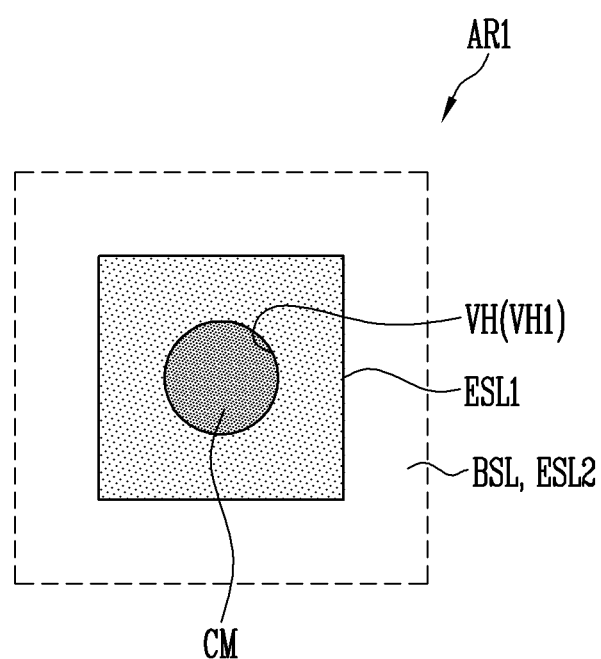
FIG. 9 is a schematic plan view illustrating region AR1 shown in FIG. 8A.

In the embodiments shown in FIGS. 8B to 8D, the display element layer DPL may include at least one light emitting element LD formed in each pixel region, and the light emitting element LD may be a nano-scale inorganic light emitting diode NED having a micro-scale or nano-scale size, which may be provided in a structure in which a nitride-based semiconductor may be grown. The display element layer DPL may include first and second bank patterns BNK1 and BNK2, first and second electrodes ELT1 and ELT2, first and second insulating layers INS1 and INS2, and first and second contact electrodes CNE1 and CNE2. In an embodiment, each light emitting element LD may be a nano-scale inorganic light emitting diode NED having a rod-like shape of which aspect ratio may be greater than about 1, but the disclosure is not limited thereto.

The first bank pattern BNK1 may be provided and/or formed on the passivation layer PSV, and be located in an emission region in which light may be emitted in each pixel PXL. The first bank pattern BNK1 may be disposed under one region of each of the first and second electrodes ELT1 and ELT2 to guide light emitted from the light emitting elements LD in an image display direction of the display device DD (e.g., an upper direction of each pixel PXL including a viewing angle range), to allow the one region of each of the first and second electrodes ELT1 and ELT2 to protrude in the upper direction. The first bank pattern BNK1 may include an inorganic insulating layer made of an inorganic material or an organic insulating layer made of an organic material. In some embodiments, the first bank pattern BNK1 may include a single-layered organic insulating layer and/or a single-layered inorganic insulating layer, but the disclosure is not limited thereto.

The second bank BNK2 may be disposed in a non-emission region of each pixel PXL and/or a non-emission region between the pixels PXL to surround the emission region of each pixel PXL. The second bank pattern BNK2 may be a structure defining (or partitioning) the emission region of each of the pixels PXL, and may be, for example, the pixel defining layer PDL. The second bank pattern BNK2 may include at least one light blocking material and/or at least one reflective material.

Each of the first and second electrodes ELT1 and ELT2 may be disposed over the first bank pattern BNK1 to have a surface profile corresponding to the shape of the first bank pattern BNK1. Each of the first and second electrodes ELT1 and ELT2 may be made of a material having a uniform reflexibility to allow light emitted from each of the light emitting elements LD to advance in the image display direction of the display device. The first electrode ELT1 may be electrically connected to the pixel circuit PXC (e.g., the first transistor M1 shown in FIG. 7B) through the contact hole CH penetrating the passivation layer PSV, and the second electrode ELT2 may be connected to a second power line (e.g., a second front power line and a second rear power line, which constitute the second power line PL2 shown in FIG. 7B) through at least one contact hole and/or at least one via hole VH in a region (not shown). The first electrode ELT1 may be an anode electrode, and the second electrode ELT2 may be a cathode electrode.

At least one light emitting element LD may be arranged between the first and second electrodes ELT1 and ELT2. In an example, as shown in FIG. 7B, a plurality of light emitting elements LD may be arranged between the first and second electrodes ELT1 and ELT2, and be connected in parallel to each other.

Each of the light emitting elements LD may emit light of any one of a color and/or white. In an embodiment, the light emitting elements LD may be provided in a form in which the light emitting elements LD may be dispersed in a solution, to be injected into each pixel PXL.

Each light emitting element LD may include a light emitting stack structure including a first semiconductor layer SCL1 (e.g., a P-type semiconductor layer), an active layer ACT, and a second semiconductor layer SCL2 (e.g., an N-type semiconductor layer), which may be sequentially disposed in one direction (e.g., a direction from a first end portion EP1 to a second end portion EP2). Also, each light emitting element LD may further include an insulative film surrounding an outer circumferential surface of the light emitting stack structure.

The first semiconductor layer SCL1 may include a first conductivity type semiconductor layer. For example, the first semiconductor layer SCL1 may include at least one p-type semiconductor layer. In an example, the first semiconductor layer SCL1 may include at least one semiconductor material among INAlGaN, GaN, AlGaN, InGaN, AlN, and InN, and include a p-type semiconductor layer doped with a first conductivity type dopant (or a p-type dopant) such as Mg.

The active layer ACT may be formed in a single-quantum well structure or a multi-quantum well structure. In some embodiments, a material such as AlGaN or AlInGaN may be used to form the active layer ACT. In addition, the active layer ACT may be formed of various materials. The position of the active layer ACT may be variously changed according to the kind of the light emitting element LD. The active layer ACT may emit light having a wavelength of about 400 nm to about 900 nm, and use a double hetero-structure.

The second semiconductor layer SCL2 may include a semiconductor layer having a type different from that of the first semiconductor layer SCL1. For example, the second semiconductor layer SCL2 may include at least one n-type semiconductor layer. In an example, the second semiconductor layer SCL2 may include any one semiconductor material among InAlGaN, GaN, AlGaN, InGaN, AlN, and InN, and be an n-type semiconductor layer doped with a second conductivity type dopant (or an n-type dopant) such as Si, Ge or Sn.

The light emitting elements LD may be provided and/or formed on the first insulating layer INS1. The first insulating layer INS1 may be provided and/or formed between each of the first and second electrodes ELT1 and ELT2 and the passivation layer PSV. The first insulating layer INS1 may fill a space between each of the light emitting elements LD and the passivation layer PSV to stably support the light emitting elements LD. The first insulating layer INS1 may include at least one inorganic insulating layer and/or at least one organic insulating layer.

The second insulating layer INS2 may be disposed on one region of the light emitting elements LD. The second insulating layer INS2 may be provided and/or formed on each of the light emitting elements LD to cover a partial top surface of each of the light emitting elements LD, and expose the first and second end portions EP1 and EP2 of each of the light emitting element LD. The second insulating layer INS2 may allow the light emitting elements LD to be stably fixed thereto. In case that an empty space exists between the first insulating layer INS1 and the light emitting elements LD before the second insulating layer INS2 may be formed, the empty space may be partially filled by the second insulating layer INS2.

The first contact electrode CNE1 may be disposed on the first electrode ELT1, which stably connects the first electrode ELT1 electrically and/or physically to one (e.g., the first end portion EP1) of both the end portions of each of the light emitting elements LD. The second contact electrode CNE2 may be disposed on the second electrode ELT2, which stably connects the second electrode ELT2 to the other (e.g., the second end portion EP2) of both the end portions of each of the light emitting elements LD. The first insulating layer INS1 may be removed in a region in which the first electrode ELT1 and the first contact electrode CNE may be connected to each other and a region in which the second electrode ELT2 and the second contact electrode CNE2 may be connected to each other.

The first and second contact electrodes CNE1 and CNE2 may be made of various transparent conductive materials so as to allow light which may be emitted from each of the light emitting elements LD and reflected by the first and second electrodes ELT1 and ELT2 to advance in the image display direction of the display device without loss.

The thin film encapsulation layer TFE may be provided and/or formed on the display element layer DPL including the light emitting elements LD of the pixels PXL.

The thin film encapsulation layer TFE may be provided as a single layer or a multi-layer. In an embodiment, the thin film encapsulation layer TFE may include a plurality of insulating layers covering the display element layer DPL. In an example, the thin film encapsulation layer TFE may include at least one inorganic layer and at least one organic layer.

For example, the thin film encapsulation layer TFE may have a structure in which an inorganic layer and an organic layer may be alternately stacked. In an embodiment, the thin film encapsulation layer TFE may include first to third encapsulation layers ENC1 to ENC3. The first encapsulation layer ENC1 may be disposed on the display element layer DPL, and be located throughout at least a portion of the display region DA and the non-display region NA. The second encapsulation layer ENC2 may be disposed on the first encapsulation layer ENC1, and be located throughout at least a portion of the display region DA and the non-display region NA. The third encapsulation layer ENC3 may be disposed on the second encapsulation layer ENC2, and be located throughout at least a portion of the display region DA and the non-display region NA. In an embodiment, the first and third encapsulation layers ENC1 and ENC3 may be configured with an inorganic layer including an inorganic material, and the second encapsulation layer ENC2 may be configured with an organic layer including an organic material.

In an embodiment, the display panel DP may further include a light conversion layer LCL disposed on the display element layer DPL. For example, as illustrated in the embodiment shown in FIG. 8C, the display panel DP may include a light conversion layer LCL disposed between the display element layer DPL and the thin film encapsulation layer TFE.

Referring to FIG. 8C, the light conversion layer LCL may include at least one of a color conversion layer CCL including color conversion particles (e.g., a quantum dot QD) and a color filter CF disposed on the display element layer DPL and/or the color conversion layer CCL. For example, the light conversion layer LCL may further include the color conversion layer CCL, a cover layer CVL, a first light blocking pattern LBP1, a planarization layer PLL, the color filter CF, and a second light blocking pattern LBP2, which may be sequentially disposed on the display element layer DPL.

In an embodiment, in case that the light conversion layer LCL is directly formed on the display element layer DPL, the display element layer DPL may further include a third insulating layer INS3. The third insulating layer INS3 may include at least one organic layer and/or at least one inorganic layer, and be entirely formed on a surface of the display element layer DPL.

The color conversion layer CCL may be disposed over a light emitting element(s) LD included in at least one pixel PXL, and include color conversion particles (e.g., a quantum dot QD of a color) for converting light of a first color, which may be emitted from the light emitting element(s) LD, into light of a second color.

For example, in case that at least one pixel PXL is set as a pixel of red (or green), and light emitting elements LD of blue may be disposed as a light source of the pixel PXL, a color conversion layer CCL including a quantum dot QD of red (or green), which may be used to convert light of blue into light of red (or green), may be disposed over the pixel PXL. In addition, a color filter CF of red (or green) may be disposed above the color conversion layer CCL.

The cover layer CVL for protecting the color conversion layer CCL may be formed on the first surface BS1 of the base layer BSL including the color conversion layer CCL. In addition, the first light blocking pattern LBP1 (e.g., a first black matrix pattern) may be disposed in a region corresponding to the outside of the color conversion layer CCL.

Although an embodiment in which the first light blocking pattern LBP1 may be formed after the color conversion layer CCL may be first formed has been disclosed in FIG. 8C, the disclosure is not limited thereto. For example, a formation order of the color conversion layer CCL and the first light blocking pattern LBP1 may be changed according to a process method and/or performance of equipment, applied to the formation of the color conversion layer CCL.

The color filter CF may be disposed on the emission region of each pixel PXL. The color filter CF may include a color filter material capable of allowing light of a color corresponding to that of each pixel PXL to be selectively transmitted therethrough. The second light blocking pattern LBP2 (e.g., a second black matrix pattern) may be disposed at the outside of the color filter CF.

Although an embodiment in which the light conversion layer LCL may be disposed on the display element layer DPL in accordance with the embodiment shown in FIG. 8B has been disclosed in conjunction with FIG. 8C, the disclosure is not limited thereto. For example, in another embodiment, the light conversion layer LCL may be disposed on the display element layer DPL in accordance with the embodiment shown in FIG. 8A.

Also, although an embodiment in which the color filter CF may be directly formed on the first surface BS1 of the base layer BSL, on which the pixels PXL may be formed, has been disclosed in FIG. 8C, the disclosure is not limited thereto. For example, in another embodiment, a separate upper substrate may be disposed on the first surface BS1 of the base layer BSL, and the color conversion layer CCL and/or the color filter CF may be formed on a surface (e.g., a surface facing the pixels PXL) of the upper substrate.

As illustrated in the embodiments shown in FIGS. 8A to 8D, in case that the light conversion layer LCL and/or the thin film encapsulation layer TFE may be formed directly on the first surface BS1 of the base layer BSL, on which the pixels PXL may be disposed, a sealing region can be removed as compared with in case that the pixel PXL may be sealed by using a sealant and an upper substrate. Accordingly, the non-display region NA of the display panel DP can be minimized.

In the embodiments shown in FIG. 6A to 9, the display panel DP may further include second lines LI2 provided on the second surface BS2 of the base layer BSL. Also, the display panel DP may further include a protective layer PRL disposed on the second surface BS2 of the base layer BSL including the second lines LI2.

Each of the second lines LI2 may be connected to any one first line LI1 through at least one via hole VH. For example, each second gate line GL_R may be connected to any one first gate line GL_F through at least one first via hole VH1, and each second data line DL_R may be connected to any one first data line DL_F through at least one second via hole VH2.

In an embodiment, each second line LI2 may be integrally formed with a conductive material CM filled in each via hole VH. The conductive material CM may be considered as one region of each second line LI2.

The protective layer PRL may be entirely disposed on the second surface BS2 of the base layer BSL including the second lines LI2, and may expose one region of the second lines LI2 in a pad region PA.

For example, the protective layer PRL may entirely cover the second gate lines GL_R, and may expose one region of the second gate lines GL_R in the first pad region PA1. Similarly, the protective layer PRL may entirely cover the second data lines DL_R, and may expose one region of the second data lines DL_R in the second pad region PA2.

In an example, when assuming that the first and second pad regions PA1 and PA2 may be disposed under the pixel PXL shown in FIG. 8D (or at the periphery thereof), the protective layer PRL may expose one region of at least one second gate line GL_R and at least one data line DL_R, which may be disposed in a corresponding region, under the pixel PXL. In addition, the second gate line GL_R and the second data line DL_R may be respectively connected to a first connection film COF1 and a second connection film COF2 through the exposed region.

Figure 10A:
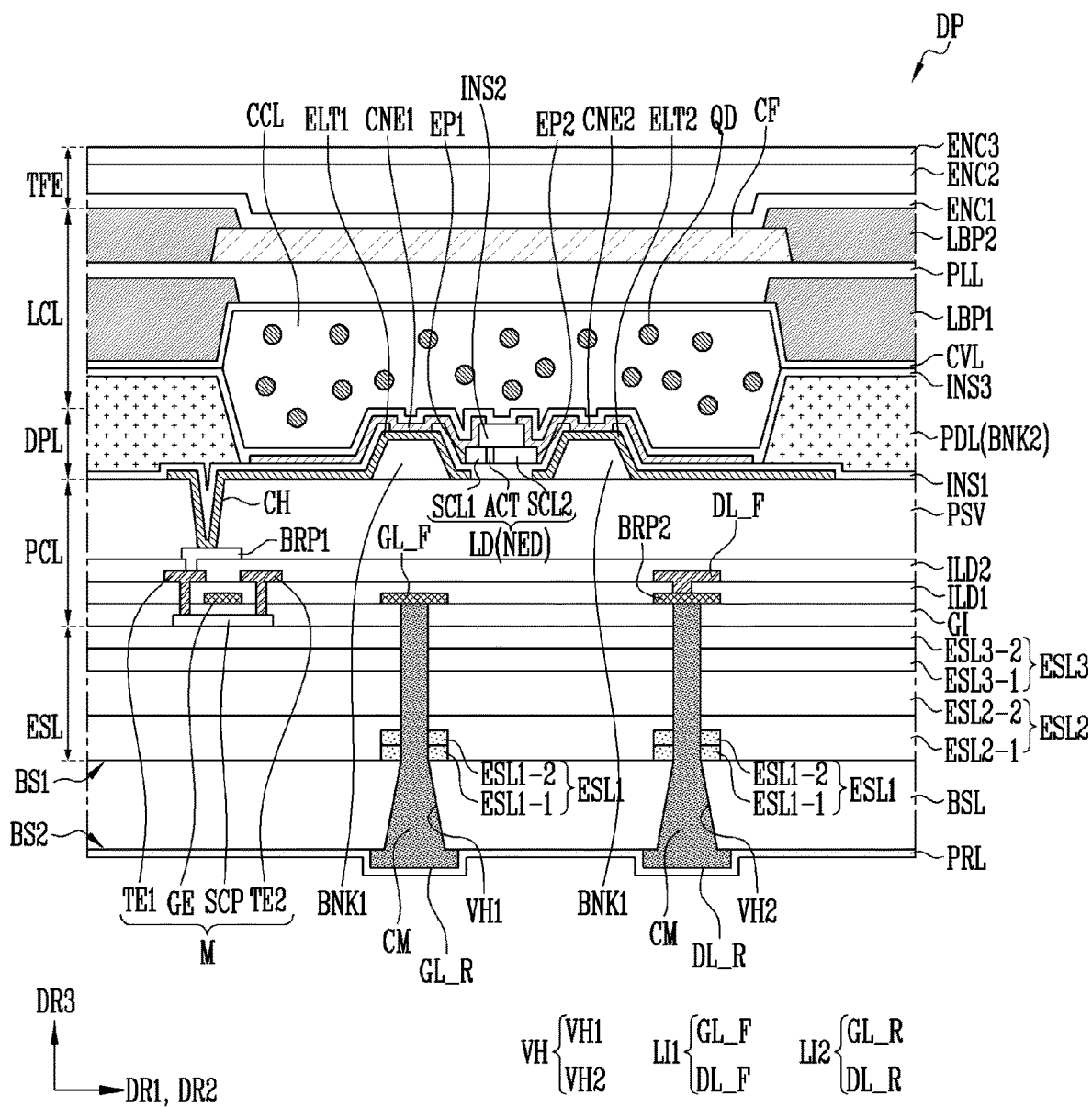
FIGS. 10A and 10B are schematic sectional views each illustrating a display panel in accordance with an embodiment of the disclosure.
Figure 10B:
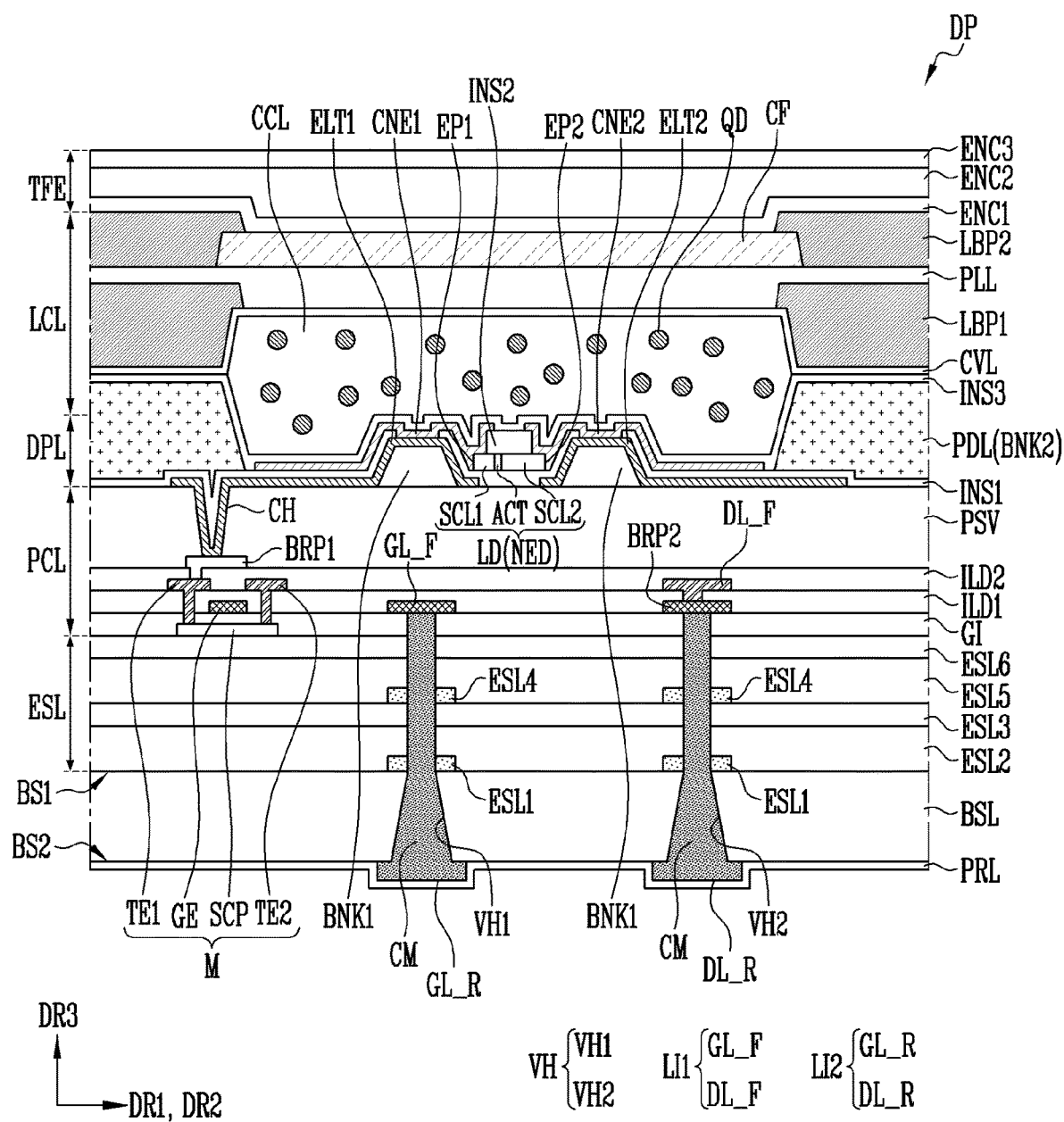
Figure 11A:
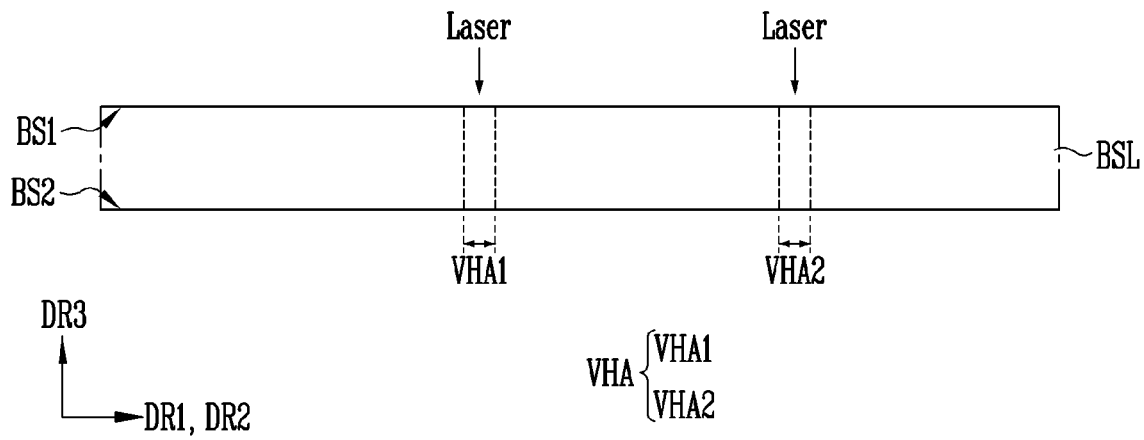
FIGS. 11A to 11J are schematic sectional views illustrating a method of fabricating a display device in accordance with an embodiment of the disclosure.
Figure 11B:
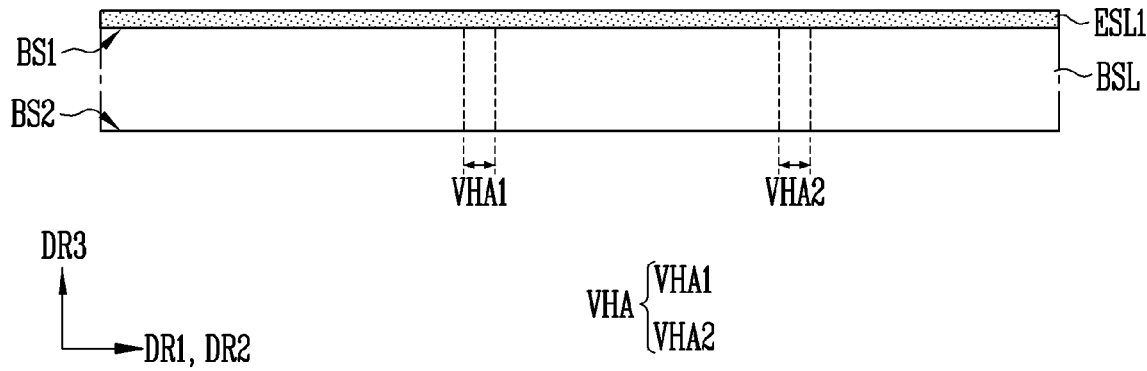
Figure 11C:
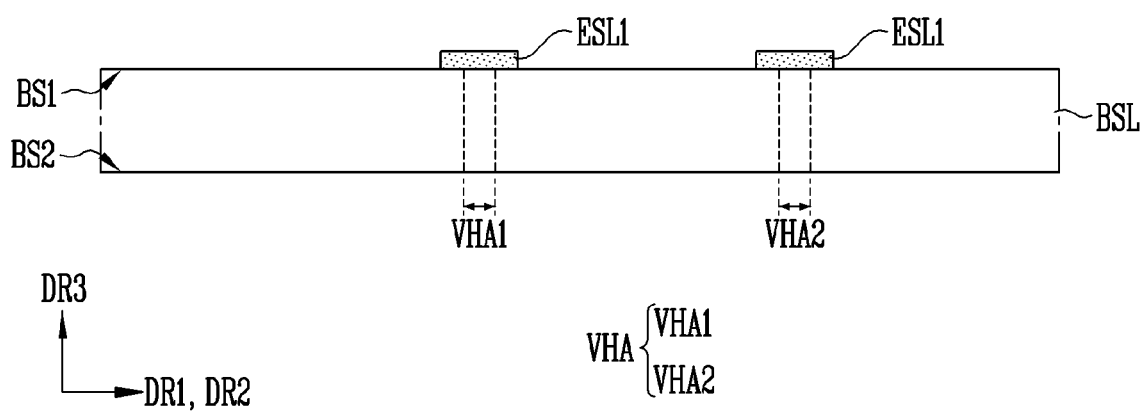
Figure 11D:
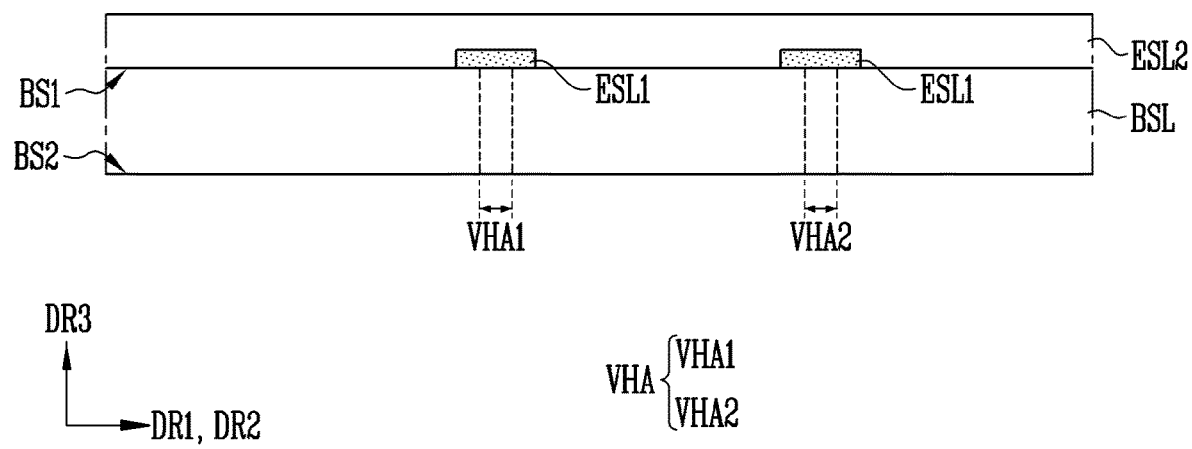
Figure 11E:
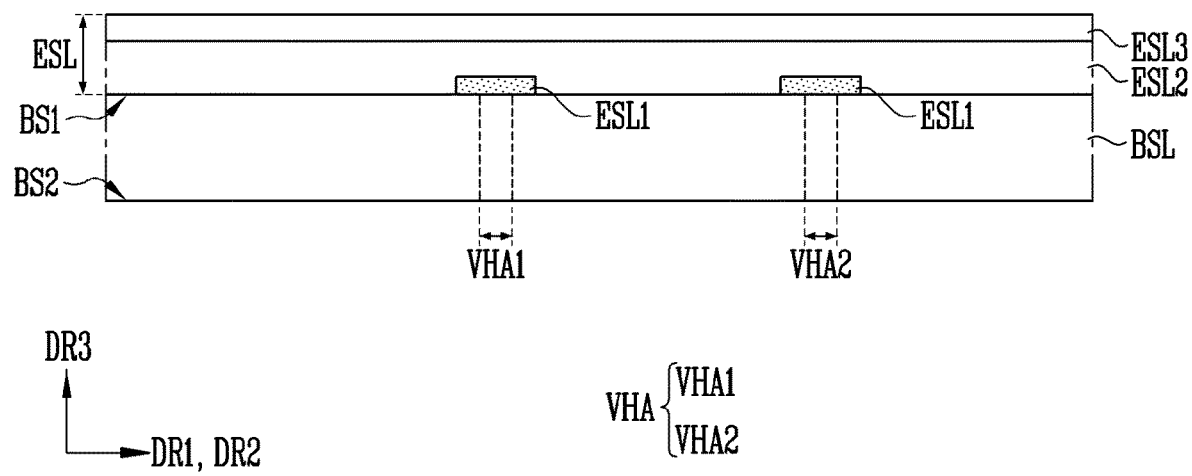
Figure 11F:
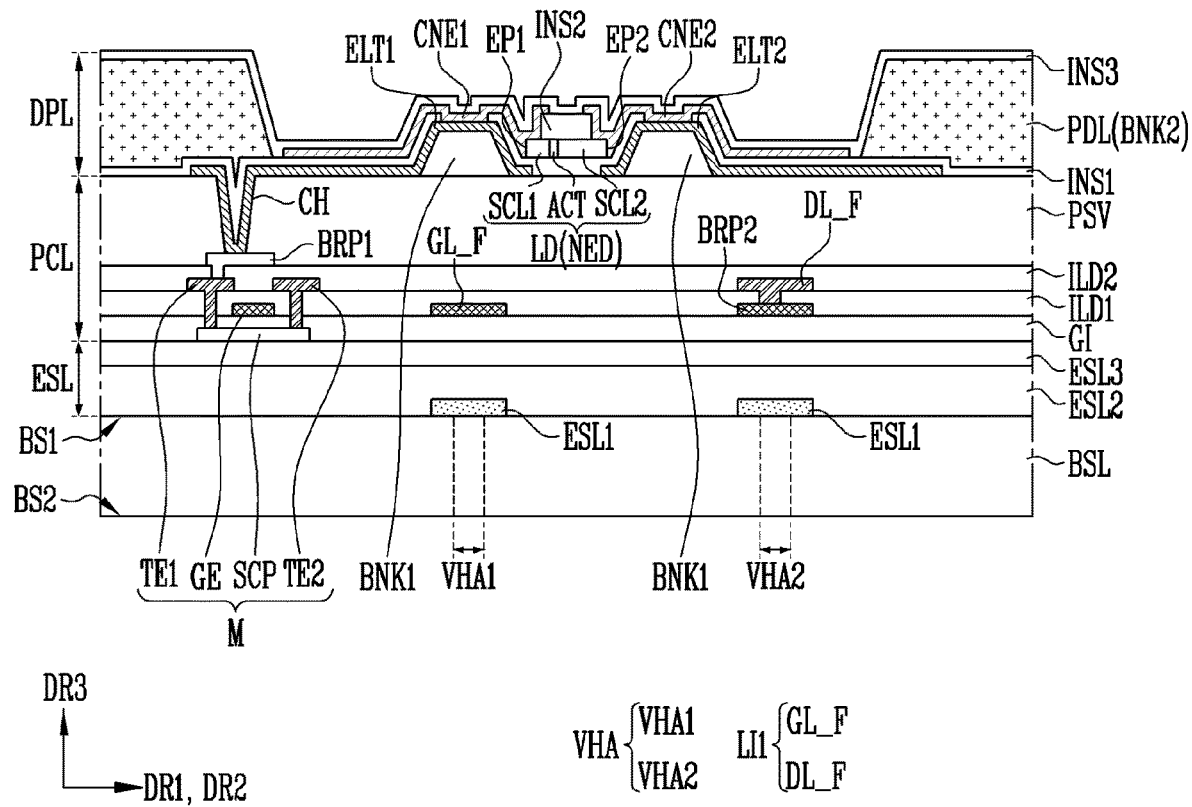
Figure 11G:
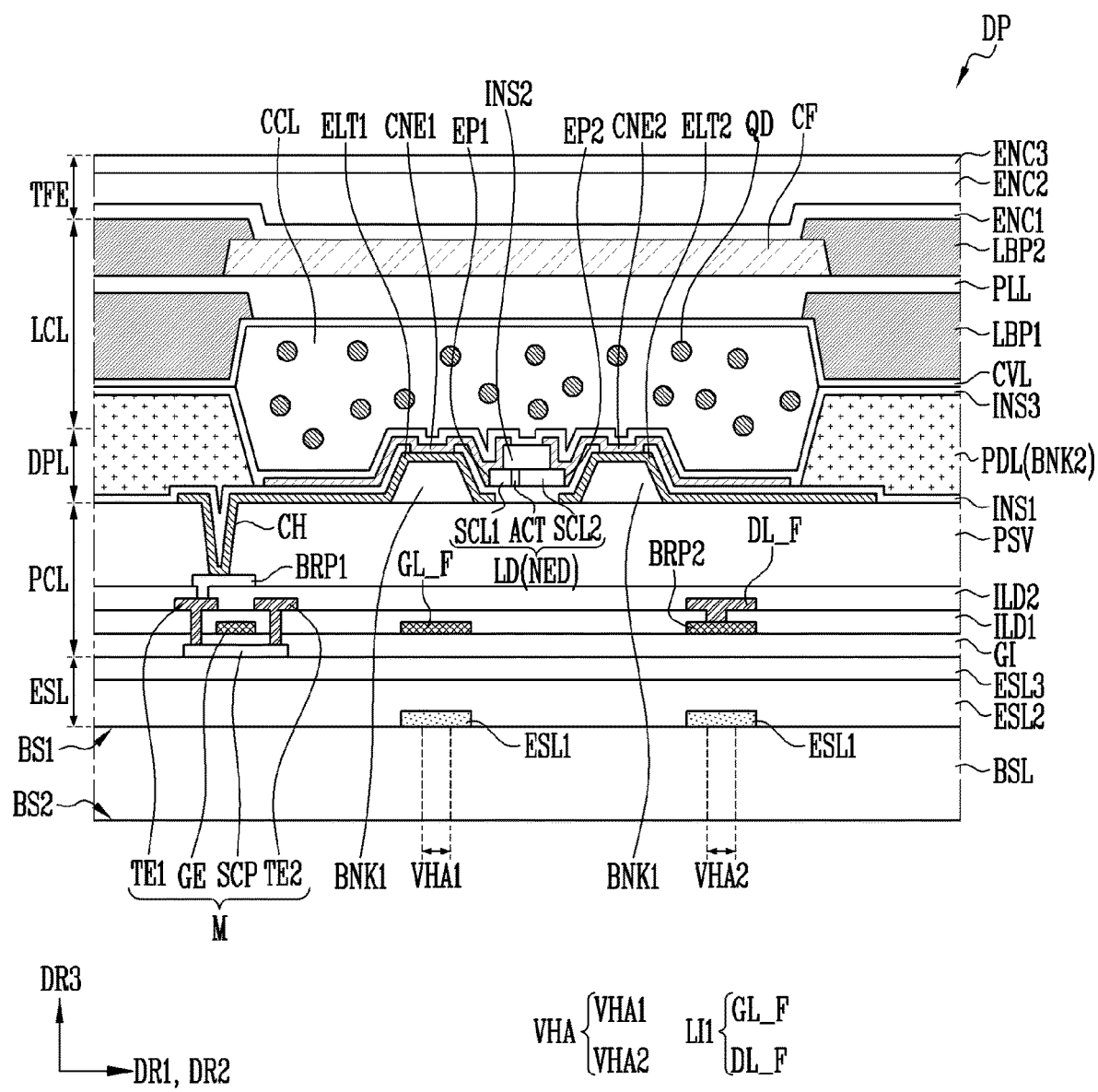
Figure 11H:
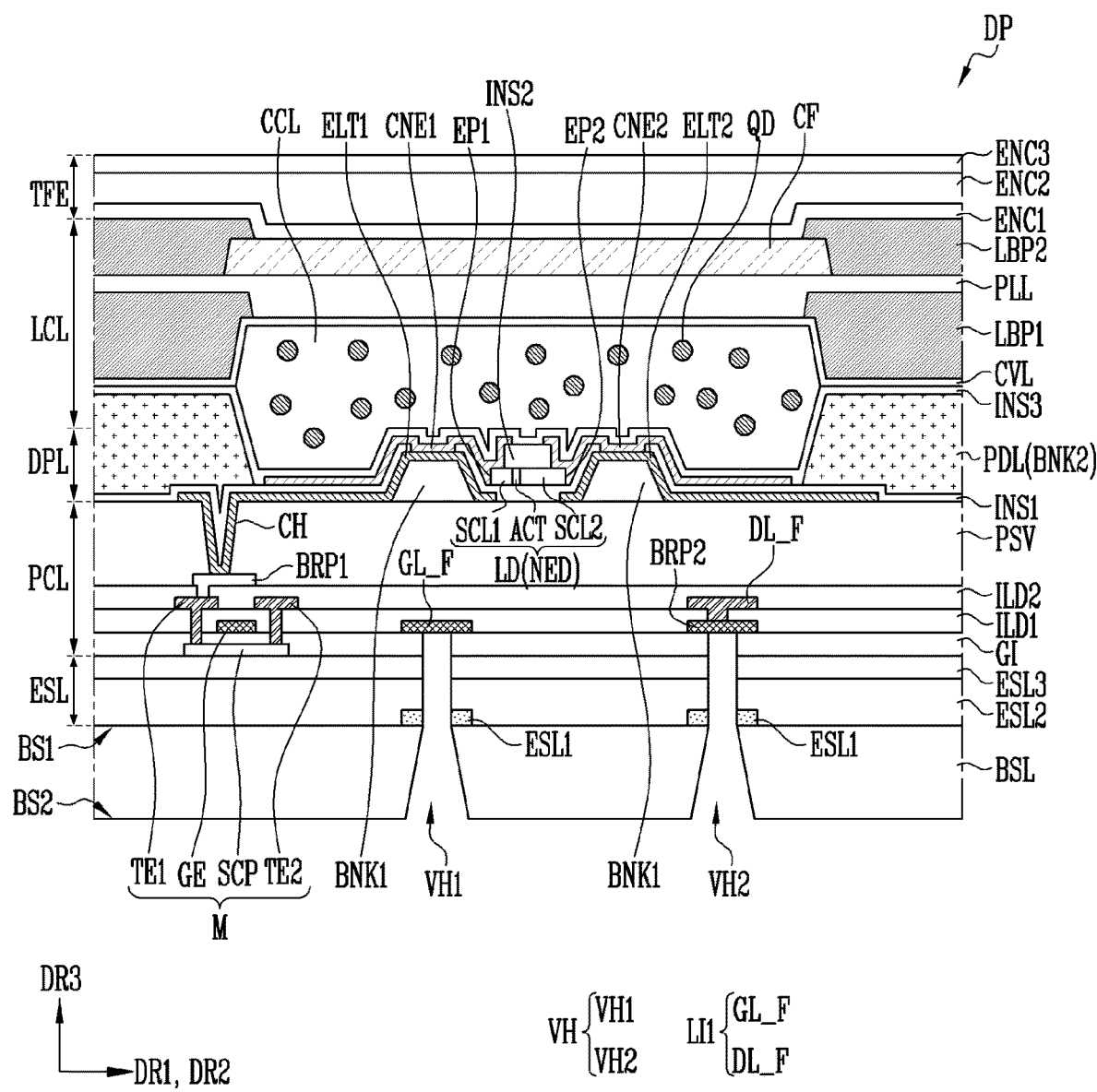
Figure 11I:
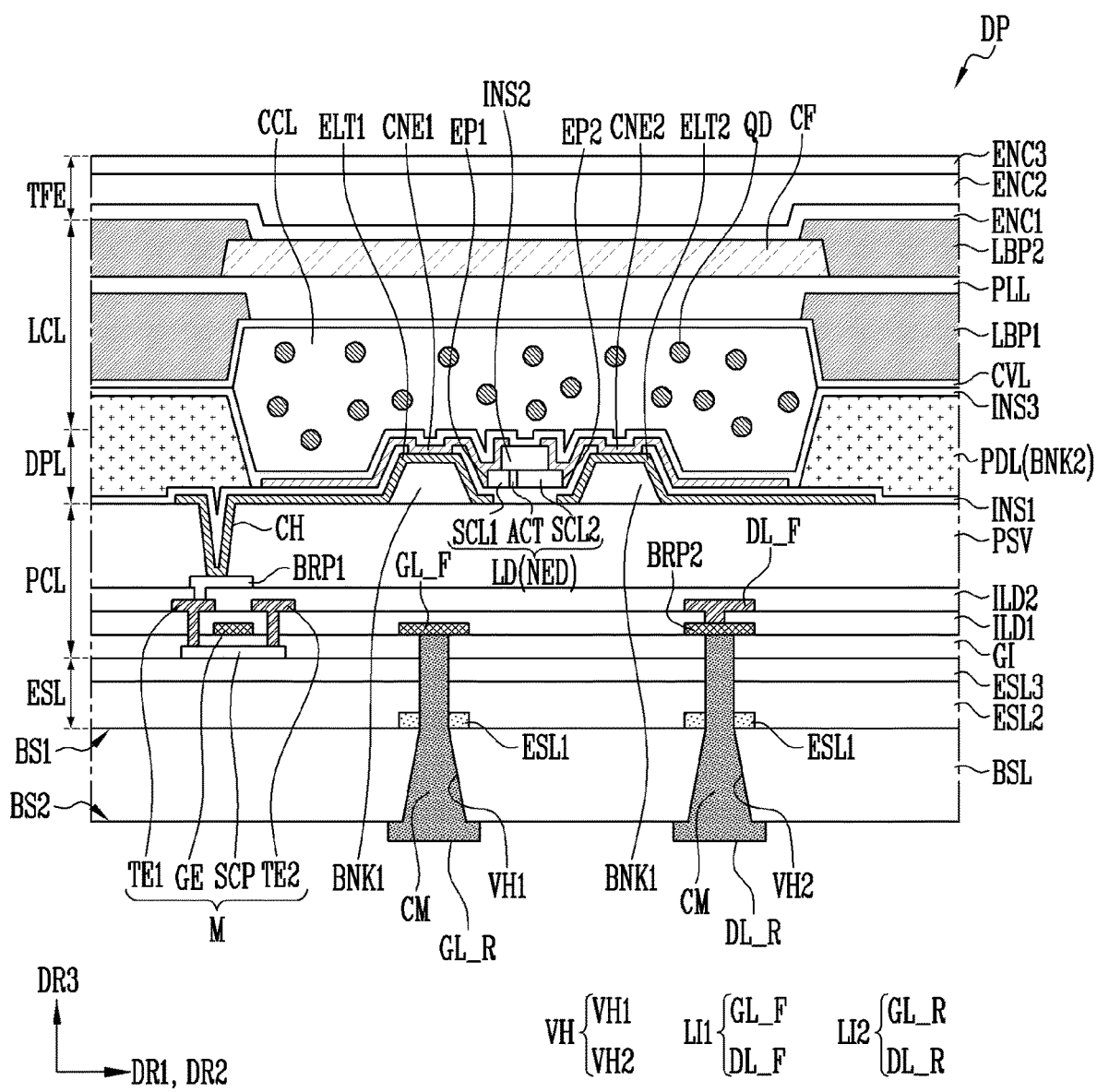
Figure 11J:
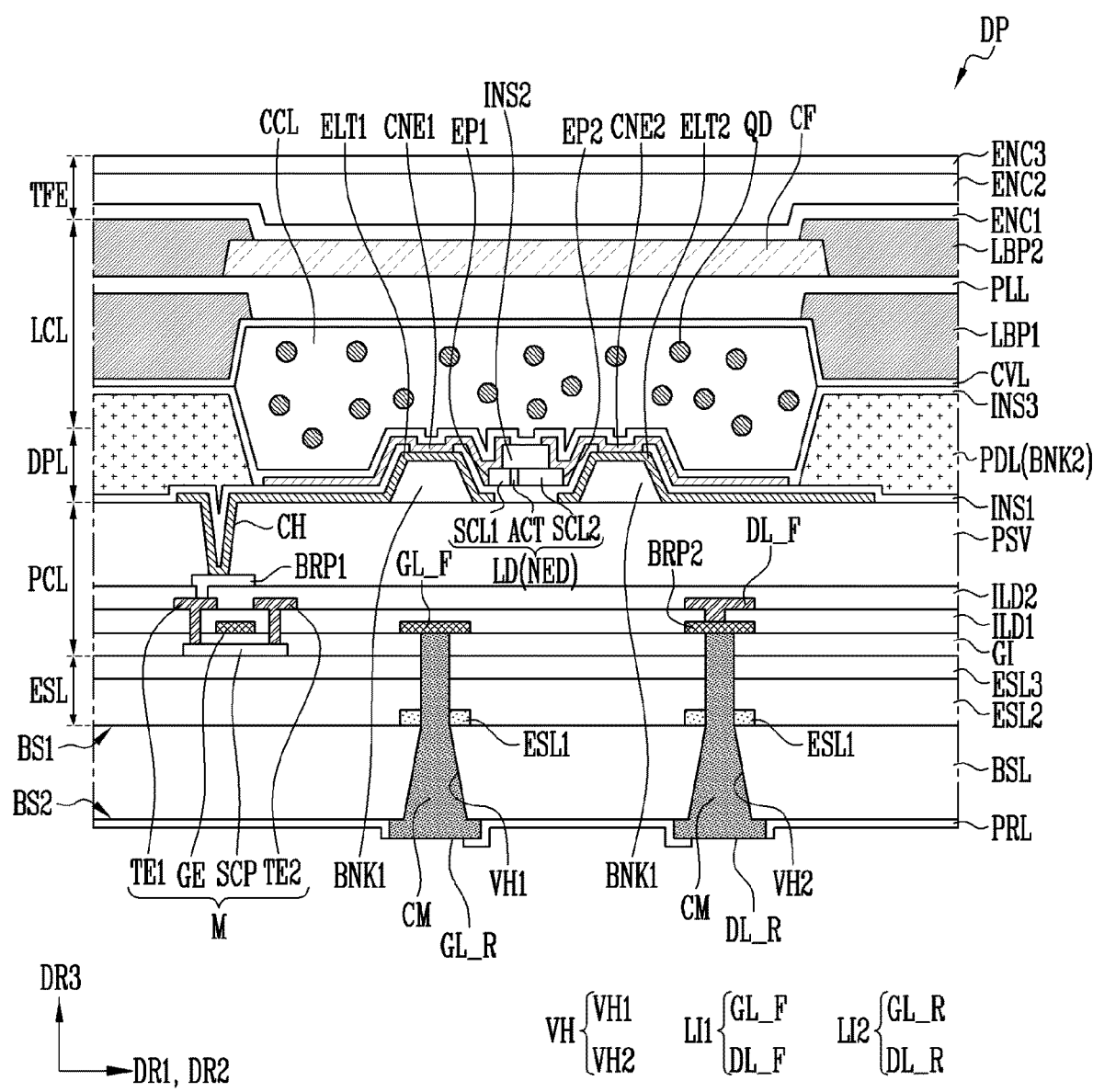

FIGS. 10A and 10B are schematic sectional views each illustrating a display panel DP in accordance with an embodiment of the disclosure. In an example, FIGS. 10A and 10B illustrate different modifications of the embodiments shown in FIGS. 8A to 8D, in relation to multi-layered etch stopper layers ESL.

In FIGS. 10A and 10B, the other components except the etch stopper layer ESL are illustrated substantially identical to those of the embodiment shown in FIG. 8C, but the disclosure is not limited thereto. For example, the embodiments shown in FIGS. 10A and 10B may be applied to display panels having various kinds and/or various structures, to which the etch stopper layer ESL of the disclosure may be applicable.

Referring to FIG. 10A, at least one of first to third etch stopper layers ESL1 to ELS3 may include multi-layered inorganic or organic insulating layers. For example, each of the first to third etch stopper layers ESL1 to ELS3 may have a multi-layered stacked structure.

The first etch stopper layer ESL1 may have a multi-layered structure including a (1-1)th etch stopper layer ESL1-1 and a (1-2)th etch stopper layer ESL1-2, which may be sequentially disposed on the first surface BS1 of the base layer BSL. In an embodiment, the (1-1)th etch stopper layer ESL1-1 and the (1-2)th etch stopper layer ESL1-2 may substantially have the same shape, the same area, and/or the same thickness, but the disclosure is not limited thereto. For example, in another embodiment, at least one of shapes, areas, and thicknesses of the (1-1)th etch stopper layer ESL1-1 and the (1-2)th etch stopper layer ESL1-2 may be different from each other. Each of the (1-1)th etch stopper layer ESL1-1 and the (1-2)th etch stopper layer ESL1-2 may include an inorganic layer, and include the same inorganic material or different inorganic materials.

The second etch stopper layer ESL2 may have a multi-layered structure including a (2-1)th etch stopper layer ESL2-1 and a (2-2)th etch stopper layer ESL2-2, which may be sequentially disposed on the first surface BS1 of the base layer BSL including the first etch stopper layer ESL1. In an embodiment, the (2-1)th etch stopper layer ESL2-1 and the (2-2)th etch stopper layer ESL2-2 may substantially have the same shape, the same area, and/or the same thickness, but the disclosure is not limited thereto. For example, in another embodiment, at least one of shapes, areas, and thicknesses of the (2-1)th etch stopper layer ESL2-1 and the (2-2)th etch stopper layer ESL2-2 may be different from each other. Each of the (2-1)th etch stopper layer ESL2-1 and the (2-2)th etch stopper layer ESL2-2 may include an organic layer, and include the same organic material or different organic materials.

The third etch stopper layer ESL3 may have a multi-layered structure including a (3-1)th etch stopper layer ESL3-1 and a (3-2)th etch stopper layer ESL3-2, which may be sequentially disposed on the second etch stopper layer ESL2. In an embodiment, the (3-1)th etch stopper layer ESL3-1 and the (3-2)th etch stopper layer ESL3-2 may substantially have the same shape, the same area, and/or the same thickness, but the disclosure is not limited thereto. For example, in another embodiment, at least one of shapes, areas, and thicknesses of the (3-1)th etch stopper layer ESL3-1 and the (3-2)th etch stopper layer ESL3-2 may be different from each other. Each of the (3-1)th etch stopper layer ESL3-1 and the (3-2)th etch stopper layer ESL3-2 may include an inorganic layer, and include the same inorganic material or different inorganic materials.

Referring to FIG. 10B, the display panel DP may include an etch stopper layer ESL having a pattern in which a first etch stopper layer ESL1, a second etch stopper layer ESL2, and/or a third etch stopper layer ESL3 may be repeated at least once. For example, the display panel DP may further include at least one of fourth, fifth, and sixth etch stopper layers ESL4, ESL5, and ESL6, which may be disposed on the first surface BS1 of the base layer BSL, on which the first to third etch stopper layers ESL1 to ESL3 may be disposed, and respectively correspond to the first, second, and third etch stopper layers ESL1, ESL2, and ESL3.

The fourth etch stopper layer ESL4 may be disposed on the third etch stopper layer ESL3 to surround each via hole VH when viewed on at least one plane. The fourth etch stopper layer ESL4 may include at least one inorganic layer (e.g., an inorganic insulating layer). In an embodiment, the fourth etch stopper layer ESL4 may include the same inorganic material as the first etch stopper layer ESL1, but the disclosure is not limited thereto.

Also, the fourth etch stopper layer ESL4 may have a shape and/or a size, substantially similar or equal to a shape and/or a size of the first etch stopper layer ESL1. In an example, the fourth etch stopper layer ESL4 may include a plurality of inorganic layer patterns separated from each other while surrounding each via hole VH. However, the disclosure is not limited thereto. For example, in another embodiment, the fourth etch stopper layer ESL4 may have a shape and/or a size, different from the shape and/or the size of the first etch stopper layer ESL1.

The fifth etch stopper layer ESL5 may be entirely disposed on the first surface BS1 of the base layer including the fourth etch stopper layer ESL4, and be opened in a region corresponding to the via holes VH. The fifth etch stopper layer ESL5 may include at least one organic layer (e.g., an organic insulating layer). In an embodiment, the fifth etch stopper layer ESL5 may include the same organic material as the second etch stopper layer ESL2, but the disclosure is not limited thereto.

The sixth etch stopper layer ESL6 may be entirely disposed on the fifth etch stopper layer ESL5, and be opened in the region corresponding to the via holes VH. The sixth etch stopper layer ESL6 may include at least one inorganic layer (e.g., an inorganic insulating layer). In an embodiment, the sixth etch stopper layer ESL6 may include the same inorganic material as the third etch stopper layer ESL3, but the disclosure is not limited thereto.

FIGS. 11A to 11J are schematic sectional views illustrating a method of fabricating a display device DD in accordance with an embodiment of the disclosure. In an example, FIGS. 11A to 11J sequentially illustrate a method of fabricating the display panel DP in accordance with the embodiment shown in FIG. 8C.

Referring to FIGS. 6A to 11A, a base layer BSL may be prepared, in which via hole regions VHA (VHA1, VHA2) may be defined. Also, the base layer BSL may be processed by irradiating laser onto the via hole regions VHA. In an embodiment, the base layer BSL may be a glass substrate using glass as a main material, but the disclosure is not limited thereto. For example, in another embodiment, the base layer BSL may be a film substrate including a polymer organic material.

The via hole regions VHA may include first via hole regions VHA1 corresponding to respective first via holes VH1 and second via hole regions VHA2 corresponding to respective second via holes VH2. In case that laser is irradiated onto the via hole regions VHA, at least a portion of the base layer BSL may be removed in each via hole region VHA, or a property of the base layer BSL may be changed in each via hole region VHA.

Referring to FIGS. 6A to 11B, a first etch stopper layer ESL1 may be primarily formed on a first surface BS1 of the laser-processed base layer BSL. In an embodiment, the first etch stopper layer ESL1 may be formed through a deposition process such as chemical vapor deposition (CVD), but the formation method of the first etch stopper layer ESL1 is not limited thereto. The first etch stopper layer ESL1 may be first formed as a single layer or a multi-layer by using at least one inorganic insulating material among silicon nitride (SiNx), silicon oxide (SiOx), and silicon oxynitride (SiOxNy), but the material forming the first etch stopper layer ESL1 is not limited thereto.

Referring to FIGS. 6A to 11C, the first etch stopper layer ESL1 may be patterned to cover each via hole region VHA on the first surface BS1 of the base layer BSL. In an example, the first etch stopper layer ESL1 may be patterned to include a separated inorganic layer pattern covering the respective via hole regions VHA. In an embodiment, the first etch stopper layer ESL1 may be patterned through a photo process, etc., but the patterning method of the first etch stopper layer ESL is not limited thereto.

Referring to FIGS. 6A to 11D, a second etch stopper layer ESL2 including an organic layer may be formed on the first surface of the base layer BSL including the first etch stopper layer ESL1. In an embodiment, the second etch stopper layer ESL2 may be formed through a coating and heat treatment process of the organic layer, but the formation method of the second etch stopper layer ESL2 is not limited thereto. The second etch stopper layer ESL2 may be formed as a single layer or a multi-layer by using at least one organic insulating material such as polyimide, but the material forming the second etch stopper layer ESL2 is not limited thereto.

Referring to FIGS. 6A to 11E, a third etch stopper layer ESL3 including an inorganic layer may be formed on the first surface BS1 of the base layer BSL including the second etch stopper layer ESL2. In an embodiment, the third etch stopper layer ESL3 may be formed through a deposition process such as chemical vapor deposition (CVD), but the formation method of the third etch stopper layer ESL3 is not limited thereto. The third etch stopper layer ESL3 may be formed as a single layer or a multi-layer by using at least one inorganic insulating material among silicon nitride (SiNx), silicon oxide (SiOx), and silicon oxynitride (SiOxNy), but the material forming the third etch stopper layer ESL2 is not limited thereto.

Referring to FIGS. 6A to 11F, a pixel process may be performed, in which pixels PXL and first lines LI1 may be formed on the first surface BS1 of the base layer BSL including a multi-layered etch stopper layer ESL. In an example, a pixel circuit layer PCL and a display element layer DPL may be sequentially formed on the third etch stopper layer ESL3.

Referring to FIGS. 6A to 11G, a light conversion layer LCL and a thin film encapsulation layer TFE may be sequentially formed on the first surface BS1 of the base layer BSL including the pixels PXL. In another embodiment, in case that the display panel DP may not include the light conversion layer LCL, the thin film encapsulation layer TFE may be formed directly on the display element layer DPL.

Referring to FIGS. 6A to 11H, via holes VH exposing one region of each of the first lines LI1 may be formed by etching the base layer BSL and the multi-layered etch stopper layer ESL in the via hole regions VHA. In an embodiment, etching processes of the base layer BSL, the first etch stopper layer ESL1, the second etch stopper layer ESL2, and/or the third etch stopper layer ESL3 may be sequentially performed or be simultaneously performed. In an example, the first etch stopper layer ESL1 may be etched together with the base layer BSL.

In some embodiments, the etching process may include a wet etching process. An etchant used in the wet etching process may include hydrofluoric acid (HF) or potassium hydroxide (KOH), but the disclosure is not limited thereto.

The multi-layered etch stopper layer ESL may be first formed on the first surface BS1 of the base layer BSL, and the pixels PXL and the first lines LI1 may be formed on the etch stopper layer ESL, so that circuit elements on the top of the etch stopper layer ESL and the first lines LI1 can be protected from the etchant. In addition, the first etch stopper layer ESL1 may be formed to cover the via hole regions VHA in a certain range or more. Accordingly, although a crater occurs in the base layer BSL due to laser irradiation, a layer separation phenomenon caused by the crater can be prevented.

Referring to FIGS. 6A to 11I, a conductive material CM may be filled in each via hole VH, and second lines LI2 may be formed on a second surface BS2 of the base layer BSL. Each of the second lines LI2 may be formed to be connected to each first line LI1 through at least one via hole VH.

In an embodiment, the via holes VH may be filled by using a material forming the second lines LI2 in the process of forming the second lines LI2. The conductive material CM and the second lines LI2 may be simultaneously formed. In an embodiment, the second lines LI2 may include a metal material having a low resistance, but the material forming the second lines LI2 is not limited thereto.

Subsequently, as shown in FIG. 8C, a protective layer PRL covering the second lines LI2 may be formed on the second surface BS2 of the base layer BSL including the second lines LI2.

Referring to FIGS. 6A to 11J, the protective layer PRL may be etched to expose one region of the second lines LI2 in a pad region PA as shown in FIGS. 6B and 8D.

Subsequently, as shown in FIG. 8D, the second lines LI2 may be connected to each driving circuit by disposing a connection film including a first connection film COF1 and a second connection film COF2 on the exposed second lines LI2. Such a rear bonding method may be applied, so that a non-display region NA of the display panel DP can be reduced or be substantially removed.

As described above, in the display device DD and the method of fabricating the same in accordance with various embodiments of the disclosure, the first lines LI1 and the second lines LI2, which may be formed on both the surfaces of the base layer BSL may be connected to each other through the via holes VH penetrating the base layer BSL of the display panel DP. Accordingly, the pad region PA may be formed on the other surface (e.g., the second surface BS2) of the display panel DP, so that the non-display region NA on a front surface (e.g., the first surface BS1) of the display panel DP can be reduced or minimized.

In an embodiment, the via holes VH and/or the pad region PA may be disposed in a region overlapping a display DA of the display panel DP. In addition, the thin film encapsulation layer TFE may be directly formed on the first surface BS1 of the base layer BSL, on which the pixels PXL may be disposed. Accordingly, the non-display region of the display panel DP can be more effectively reduced or be substantially removed.

In an embodiment, the pixels PXL may include nano-scale inorganic light emitting diodes NED as a light source. The inorganic light emitting diodes NED has a characteristic strong against penetration of moisture or oxygen. Accordingly, the reliability of the pixels PXL can be ensured even in case that the via holes VH may be formed in the display region DA.

In accordance with the embodiments of the disclosure, in case that the non-display region NA of the display panel DP is reduced, a wider screen can be provided. In addition, in case that a multi-screen display device DD using a plurality of display panels DP is implemented, viewing of a boundary region between the display panels DP can be minimized, and a more natural screen can be implemented.

Further, in the display device DD and the method of fabricating the same in accordance with the embodiments of the disclosure, a multi-layered etch stopper layer ESL may be formed on the first surface BS1 of the base layer BSL, on which the pixels PXL and the first lines LI1 may be formed. In an example, the multi-layered etch stopper layer ESL, which may include a first etch stopper layer ESL1 as an inorganic layer having a size enough to sufficiently cover a crater while surrounding each via hole VH and a second etch stopper layer ESL2 as an organic layer entirely formed on the first surface BS1 of the base layer BSL including the first etch stopper layer ESL1, may be formed on the first surface BS1 of the base layer BSL. Accordingly, although a crater occurs in the base layer BSL in the process of forming the via holes VH, lifting or separation of the multi-layered etch stopper layer ESL and/or an upper layer thereof can be prevented.

Accordingly, the pixels PXL and the first lines LI1 may be stably formed on the first surface BS1 of the base layer BSL in a subsequent process, and the reliability of the display panel DP can be ensured.

In the display device and the method of fabricating the same in accordance with the disclosure, the non-display region of the display panel may be reduced (or removed), so that a wider screen can be provided. In addition, the non-display region of each display panel may be reduced, so that viewing of a boundary region between a plurality of display panels can be minimized in case that a multi-screen display device using the plurality of display panels is implemented. Accordingly, a more natural screen can be implemented.

Further, in the display device and the method of fabricating the same in accordance with the disclosure, a multi-layered etch stopper layer sequentially including an inorganic layer and an organic layer may be formed in a region surrounding at least each via hole, so that, although a crater occurs in the base layer in a laser processing process for forming via holes, lifting of a layer or a separation phenomenon due to the crater can be prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the disclosure as set forth in the following claims and equivalents thereof.

What is claimed is:

1. A display device comprising:
    a base layer, the base layer including a first surface and a second surface;
    pixels and first lines that are disposed on the first surface;
    second lines disposed on the second surface and corresponding to the first lines;
    a multi-layered etch stopper layer disposed on the first surface and disposed between the base layer and the first lines; and
    via holes penetrating the base layer and the multi-layered etch stopper layer, the via holes connecting the first lines to the second lines,
    wherein the multi-layered etch stopper layer includes:
        a first etch stopper layer disposed on the first surface and surrounding each of the via holes, the first etch stopper layer including an inorganic layer; and
        a second etch stopper layer disposed on the first surface and completely covering the first etch stopper layer, the second etch stopper layer being open in a region corresponding to the via holes, and wherein
    each of the via holes has an opening at the second surface of the base layer that is larger than an opening at the first surface of the base layer.

2. The display device of claim 1, wherein the second etch stopper layer includes an organic layer.

3. The display device of claim 2, wherein the multi-layered etch stopper layer further includes a third etch stopper layer entirely disposed on the second etch stopper layer, the third etch stopper layer being open in the region corresponding to the via holes.

4. The display device of claim 3, wherein the third etch stopper layer includes an inorganic layer.

5. The display device of claim 3, wherein at least one of the first etch stopper layer, the second etch stopper layer, and the third etch stopper layer includes a multi-layered inorganic insulating layer or a multi-layered organic insulating layer.

6. The display device of claim 3, wherein the multi-layered etch stopper layer further includes at least one of:
    a fourth etch stopper layer disposed on the third etch stopper layer and surrounding each of the via holes, the fourth etch stopper layer including an inorganic layer;
    a fifth etch stopper layer entirely disposed on the first surface including the fourth etch stopper layer, the fifth etch stopper layer being open in the region corresponding to the via holes, the fifth etch stopper layer including an organic layer; and
    a sixth etch stopper layer entirely disposed on the fifth etch stopper layer, the sixth etch stopper layer being open in the region corresponding to the via holes, the sixth etch stopper layer including an inorganic layer.

7. The display device of claim 6, wherein the fourth etch stopper layer includes a plurality of inorganic layer patterns surrounding each of the via holes, the plurality of inorganic layer patterns being separated from each other.

8. The display device of claim 1, wherein the first etch stopper layer includes a plurality of inorganic layer patterns surrounding each of the via holes, the plurality of inorganic layer patterns being separated from each other.

9. The display device of claim 1, wherein
    the first lines include first gate lines and first data lines, the first gate lines and the first data lines being connected to the pixels, and
    the via holes include:
        first via holes overlapping respective first gate lines; and
        second via holes overlapping respective first data lines.

10. The display device of claim 9, wherein the second lines include:
    second gate lines each connected to each of the first gate lines through at least one of the first via holes; and
    second data lines each connected to each of the first data lines through at least one of the second via holes.

11. The display device of claim 9, wherein the pixels include:
- circuit elements connected to the first gate lines and the first data lines; and
- light emitting elements connected to the circuit elements.

12. The display device of claim 11, comprising:
- a pixel circuit layer disposed on the multi-layered etch stopper layer, the pixel circuit layer including the circuit elements and the first lines; and
- a display element layer disposed on the pixel circuit layer, the display element layer including the light emitting elements.

13. The display device of claim 12, further comprising at least one of:
- a light conversion layer disposed on the display element layer; and
- a thin film encapsulation layer disposed on the display element layer or the light conversion layer.

14. The display device of claim 13, wherein the light conversion layer includes at least one of:
- a color conversion layer disposed over a light emitting element included in at least one pixel among the pixels, the color conversion layer including color conversion particles that convert light of a first color, which is emitted from the light emitting element, into light of a second color; and
- a color filter disposed on the display element layer or the color conversion layer.

15. The display device of claim 1, wherein the via holes are disposed in a display region in which the pixels are disposed.

16. The display device of claim 1, further comprising a protective layer disposed on the second surface to cover the second surface and the second lines, the protective layer exposing a region of the second lines in a pad region.

17. The display device of claim 16, wherein
- the pad region is disposed on the second surface and overlaps a display region; and
- the display region includes the pixels and displays an image through the first surface.

18. The display device of claim 1, wherein the first etch stopper layer is disposed within a range surrounding each via hole such that a first portion of the first etch stopper layer surrounding a first via hole does not contact a second portion of the first etch stopper layer surrounding a second via hole.

19. The display device of claim 1, wherein
- the first etch stopper layer and the second etch stopper both make direct contact with the base layer, and
- the first etch stopper makes direct contact with the base layer at a periphery of each via hole.

20. The display device of claim 1, wherein
- the display device includes a display region and a non-display region surrounding the display area, and
- at least one of the via holes is disposed in the display region.

* * * * *